(12) United States Patent
Houba et al.

(10) Patent No.: US 10,187,555 B2
(45) Date of Patent: Jan. 22, 2019

(54) CAMERA SYSTEM FOR CAPTURING IMAGES AND METHODS THEREOF

(71) Applicant: AMARYLLIS INNOVATION GMBH, Berlin (DE)

(72) Inventors: Rianne Houba, Berlin (DE); Hans-Peter Constien, Berlin (DE); Robert Arend, Berlin (DE); Andreas Kampf, Kleinmachnow (DE); Thomas Gillen, Bad Saeckingen (DE); Jonas Pfeil, Berlin (DE)

(73) Assignee: AMARYLLIS INNOVATION GMBH, Berlin (DE)

( * ) Notice: Subject to any disclaimer, the term of this patent is extended or adjusted under 35 U.S.C. 154(b) by 0 days.

(21) Appl. No.: 15/519,584

(22) PCT Filed: Sep. 25, 2015

(86) PCT No.: PCT/IB2015/002022
§ 371 (c)(1),
(2) Date: Apr. 17, 2017

(87) PCT Pub. No.: WO2016/059470
PCT Pub. Date: Apr. 21, 2016

(65) Prior Publication Data
US 2017/0331986 A1 Nov. 16, 2017

Related U.S. Application Data

(60) Provisional application No. 62/138,152, filed on Mar. 25, 2015, provisional application No. 62/122,323, filed on Oct. 17, 2014.

(51) Int. Cl.
*H04N 5/225* (2006.01)
*H01R 13/502* (2006.01)
(Continued)

(52) U.S. Cl.
CPC ......... *H04N 5/2252* (2013.01); *H01R 13/502* (2013.01); *H01R 13/64* (2013.01);
(Continued)

(58) Field of Classification Search
CPC ...... H01R 13/502; H01R 13/64; H01R 31/06; H04N 5/2252; H04N 5/2253; H04N 5/2254; H04N 5/2257; H04N 5/23238; H05K 5/0026
See application file for complete search history.

(56) References Cited

U.S. PATENT DOCUMENTS

| 2004/0048507 A1* | 3/2004 | Hage | G08B 13/19619 439/332 |
| 2004/0246333 A1* | 12/2004 | Steuart, III | G03B 35/08 348/36 |

(Continued)

FOREIGN PATENT DOCUMENTS

| JP | 2001-320736 A | 11/2001 |
| WO | 2014/066405 A1 | 5/2014 |

OTHER PUBLICATIONS

International Search Report and Written Opinion, dated Feb. 11, 2016 in PCT/EB2015/002022.

*Primary Examiner* — Amy Hsu
(74) *Attorney, Agent, or Firm* — Medler Ferro Woodhouse & Mills PLLC

(57) ABSTRACT

A camera system for capturing a substantial portion of a spherical image, the capturing being triggered adjacent the highest point of a free, non-propelled trajectory, comprising two or more camera modules, the two or more camera modules being oriented with respect to in each such camera module optical main axis in two or more directions different to each other, at least one control unit that connects to the two or more camera modules, and a sensor system including an accelerometer, wherein the camera system does not comprise a position detector.

12 Claims, 26 Drawing Sheets

(51) Int. Cl.
　　　*H01R 13/64*　　　(2006.01)
　　　*H01R 31/06*　　　(2006.01)
　　　*H04N 5/232*　　　(2006.01)
　　　*H05K 5/00*　　　(2006.01)

(52) U.S. Cl.
　　　CPC ........... *H01R 31/06* (2013.01); *H04N 5/2253* (2013.01); *H04N 5/2254* (2013.01); *H04N 5/2257* (2013.01); *H04N 5/2258* (2013.01); *H04N 5/23238* (2013.01); *H05K 5/0026* (2013.01)

(56) References Cited

U.S. PATENT DOCUMENTS

| | | | |
|---|---|---|---|
| 2009/0207246 A1* | 8/2009 | Inami | G01S 3/7864 348/135 |
| 2010/0277617 A1* | 11/2010 | Hollinger | H04N 5/2252 348/231.99 |
| 2012/0026282 A1* | 2/2012 | Hsieh | H04N 5/2258 348/36 |
| 2012/0139727 A1* | 6/2012 | Houvener | A63B 26/003 340/540 |
| 2013/0210563 A1* | 8/2013 | Hollinger | H04N 5/2252 473/570 |
| 2014/0049601 A1* | 2/2014 | Pfeil | H04N 5/23238 348/36 |
| 2014/0111608 A1* | 4/2014 | Pfeil | H04N 5/23238 348/37 |
| 2015/0077543 A1* | 3/2015 | Kerr | A61B 3/113 348/135 |

* cited by examiner

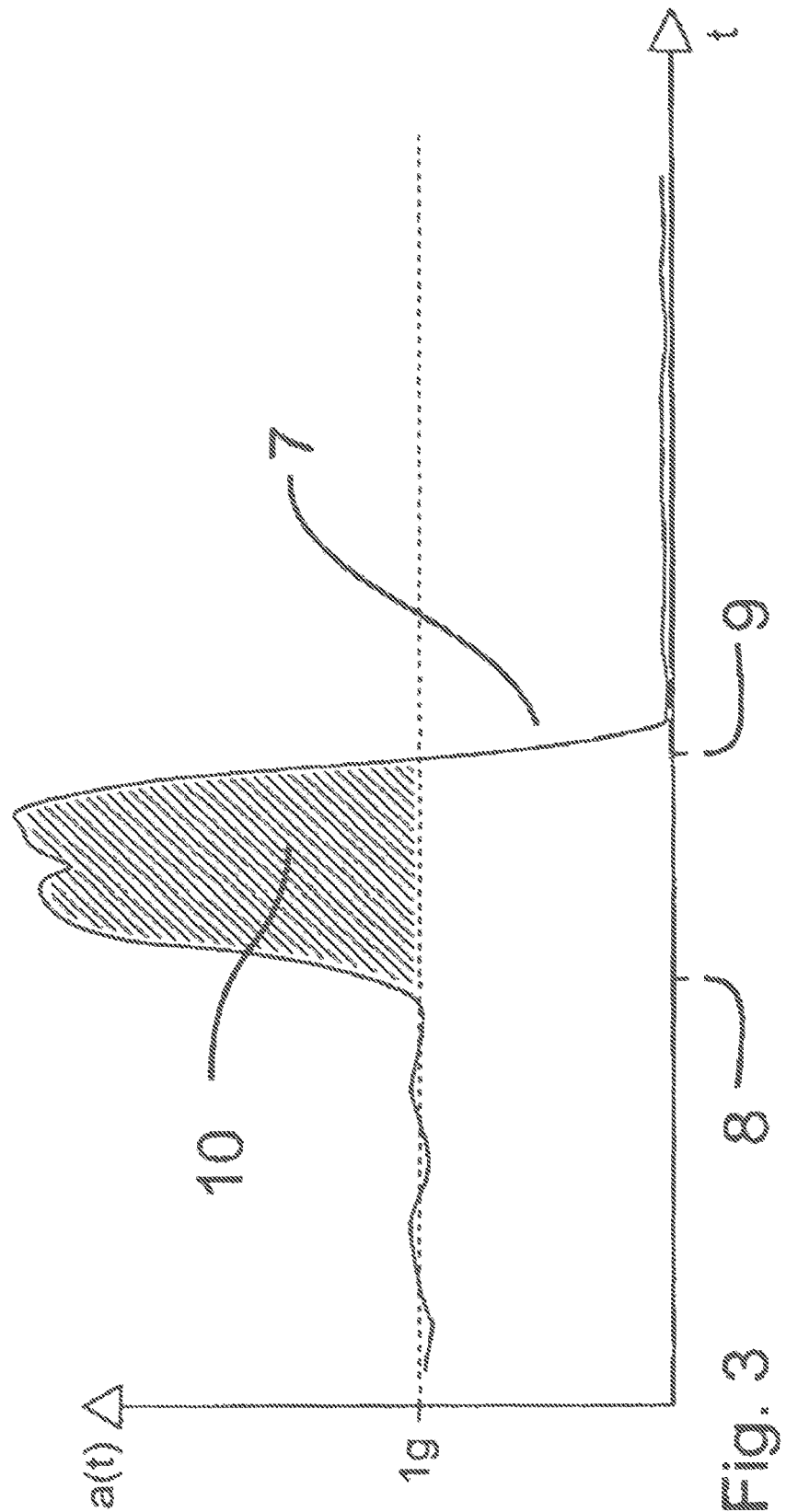

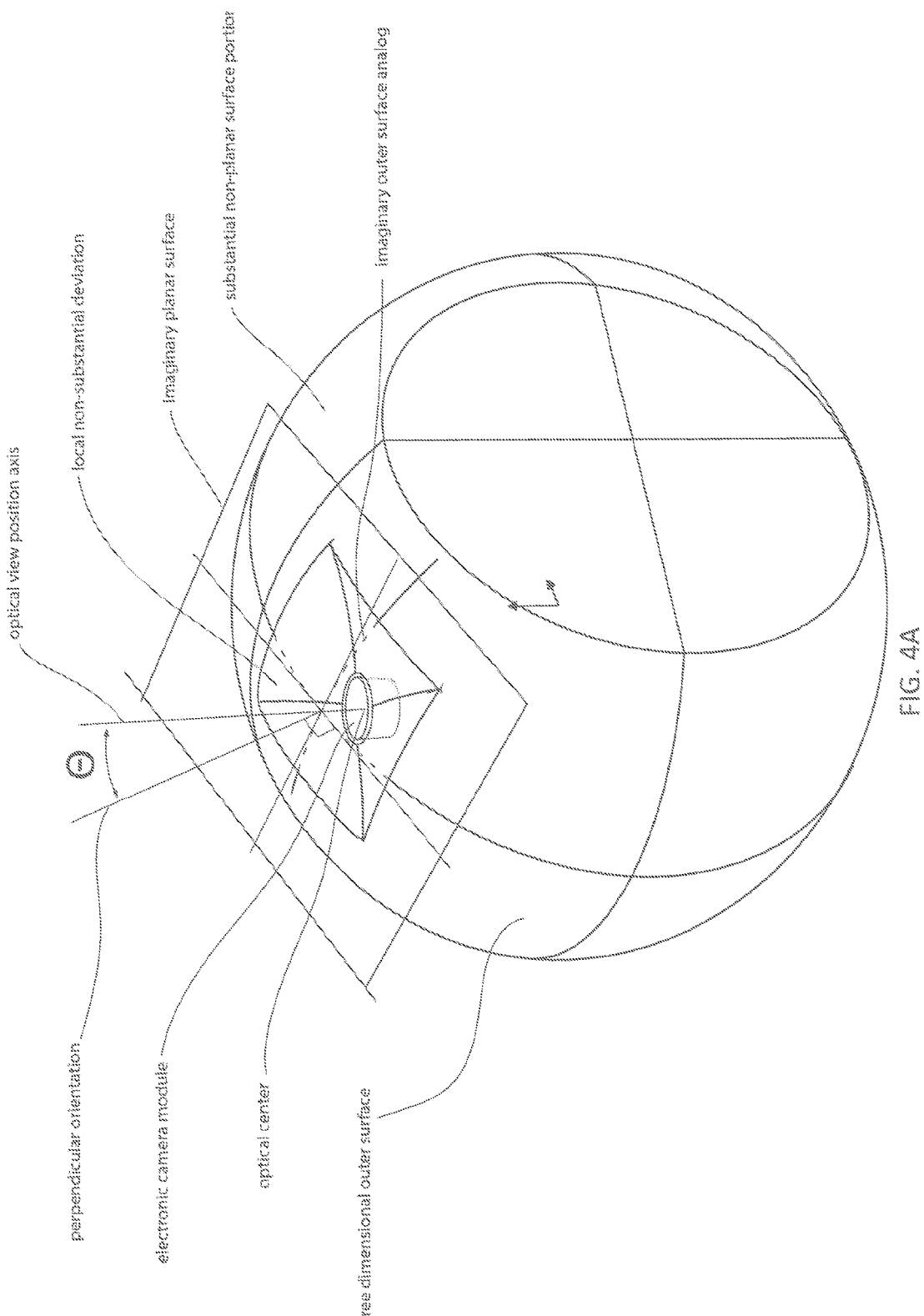

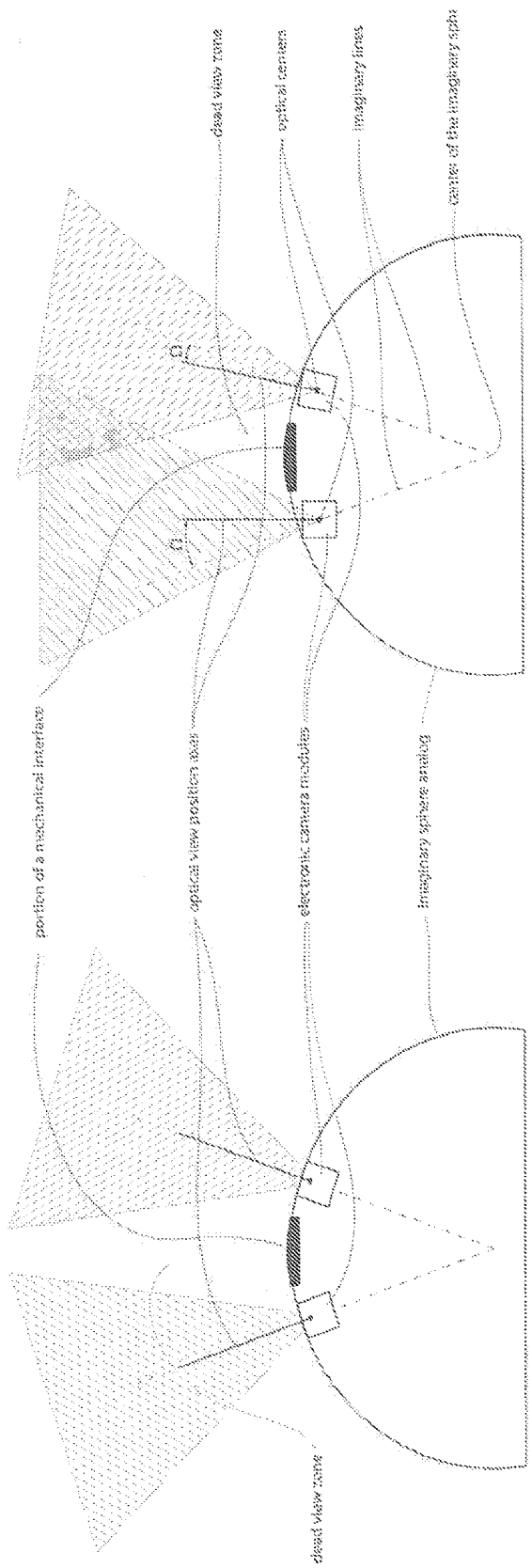

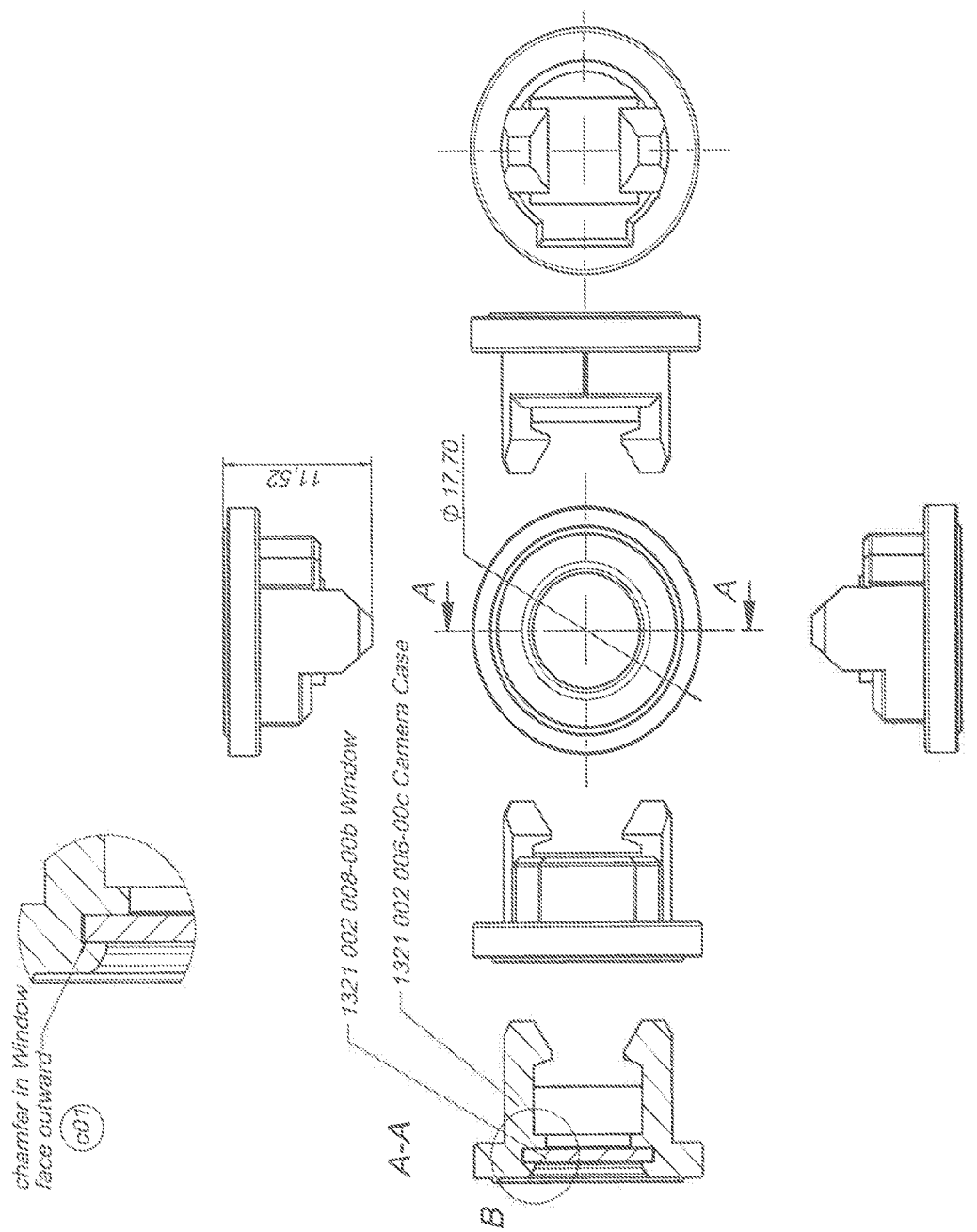

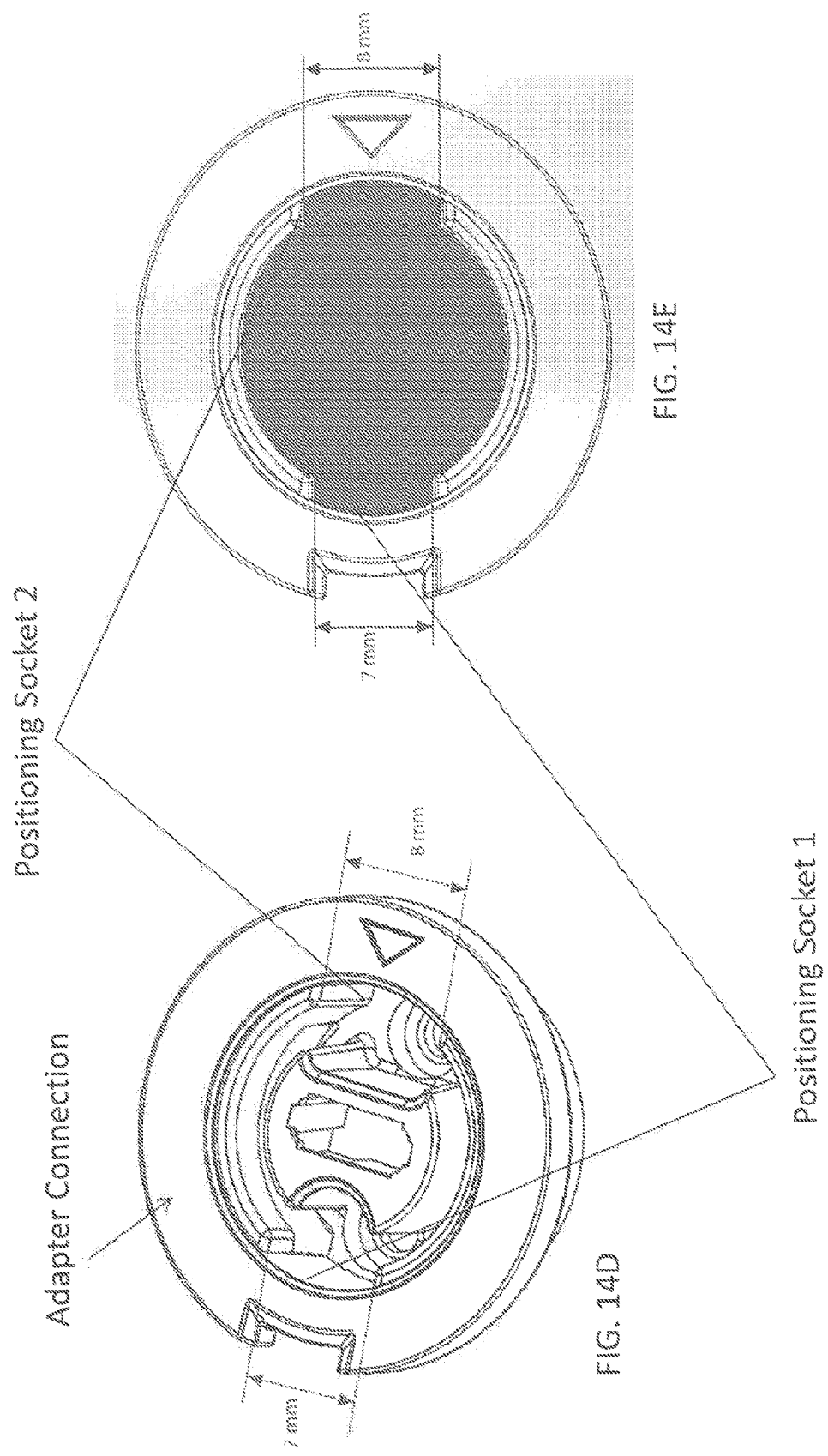

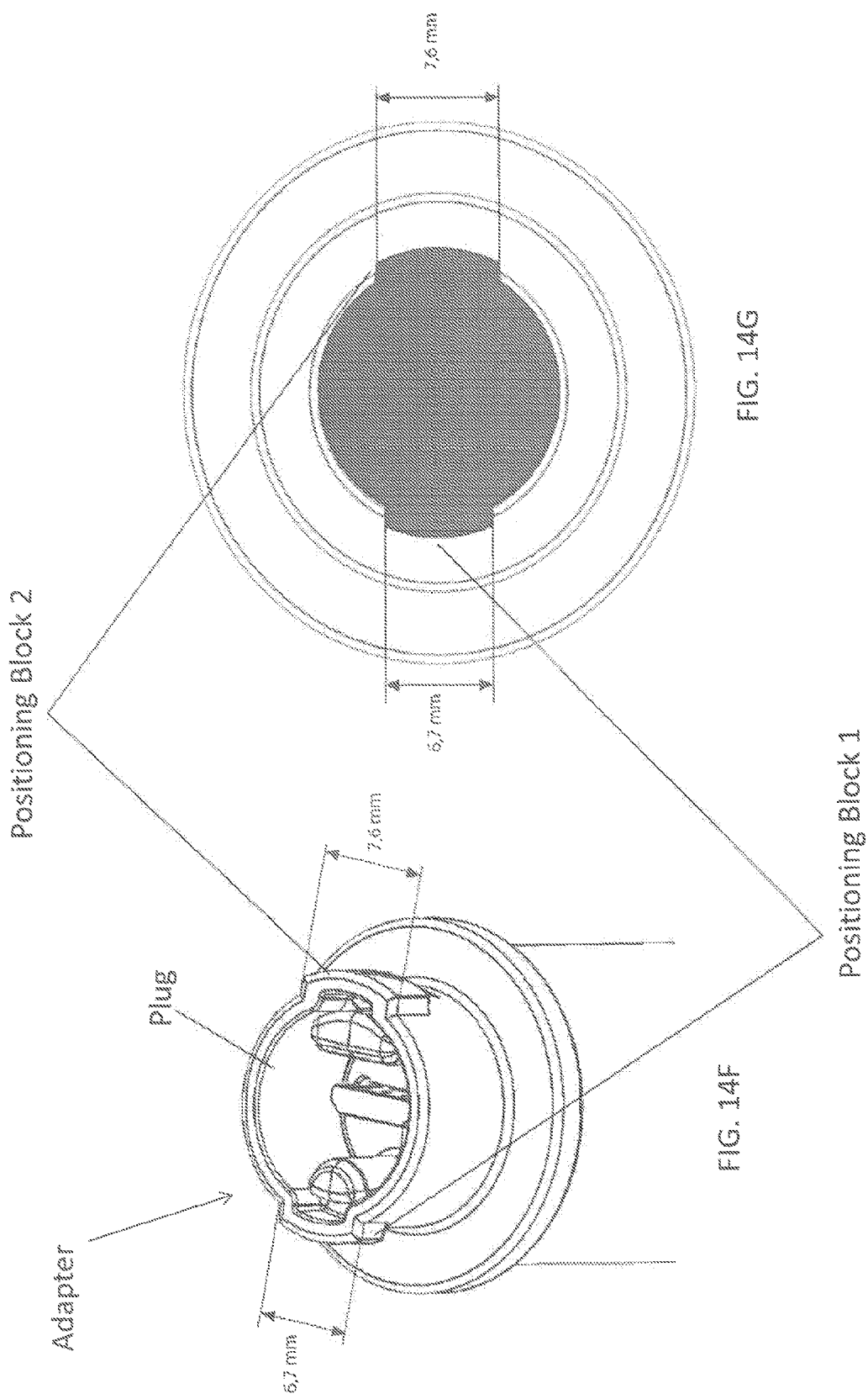

CAMERA SYSTEM FOR CAPTURING IMAGES AND METHODS THEREOF

FIELD OF THE INVENTION

The invention is directed to a camera system of capturing images consisting of at least a single camera. The invention is further directed to a method of capturing images using a camera system comprising at least a single camera and at least a control unit and a sensor, in particular an accelerometer.

BACKGROUND OF THE INVENTION

Panoramic images allow us to capture images that come close to the human visual field. They thus enable a better overall impression of a place than images of normal cameras. Panoramic cameras allow capturing such panoramic views by using a single camera or several single cameras. The images of several single cameras can be later assembled into a seamlessly composite image.

For cylindrical panoramas, special cameras exist that can project the scenery on an analog film or digital imaging sensor. Incomplete spherical panoramas can be imaged by photographing a suitably shaped mirror (e.g. ball) and distortion can subsequently be corrected. U.S. Pat. No. 3,505,465 describes a catadioptric video camera that enables a 360° panoramic view.

Fully spherical panoramas can be created by capturing single images and subsequently assembling them (automatically) by a computer. Thereby, the images can be captured either simultaneously by multiple cameras or sequentially with a single camera.

A single camera can be rotated to take overlapping images that can be assembled later. This principle works with a normal lens, fish-eye lenses and catadioptric systems.

In order to circumvent problems caused by time shifted image capturings of a single camera, multiple cameras can be mounted to cover the full solid angle of 4 pi sr. In this case the visual field of the cameras overlap and allow a later assembly of individual images.

In U.S. Pat. No. 7,463,280 an omnidirectional 3-D camera system is described which is composed of several single cameras. U.S. Pat. No. 6,947,059 describes a stereoscopic omnidirectional camera system composed of multiple single cameras. U.S. Pat. No. 5,023,725 discloses an omnidirectional camera system in which the single cameras are arranged as a dodecahedron.

The term "camera tossing" describes throwing normal cameras using a timer with preset delay for taking a photograph during flight. Several design studies for panoramic cameras exist, as well as for single cameras that are thrown or shot into the air.

"Triops" is the concept of a ball with three fish-eye lenses. The "CTRUS" football is supposed to integrate cameras into the surface of a football. The "I-Ball" design consists of two fish-eye lenses integrated into a ball to be thrown or shot in the air.

In the art, there are single cameras to be tossed in the air. "Flee" is a ball with a tail feather. "SatuGO" is a similar concept without a tail feather.

It has not been described so far how to obtain a good sharp image with these cameras that are tossed in the air.

SUMMARY OF THE INVENTION

Provided herein are camera assemblies for capturing a substantial portion of a spherical image, the camera assembly comprising an encasement to provide an integral mechanical enclosure for the camera assembly, the encasement comprising a three-dimensional outer surface having substantial non-planar surface portions, an imaginary outer surface analog representing an overall structural shape envelope of the three-dimensional outer surface, so that one or more local non-substantial deviations of the three-dimensional outer surface from the overall structural shape envelope are not included in the imaginary outer surface analog; and three or more electronic camera modules positioned in the encasement, each electronic camera module having an optical view position axis, wherein the orientation of the optical view position axis of each electronic camera module is different from the orientation of the optical view position axis of all but at least one other electronic camera module (or in other embodiments is different from all of the other electronic camera modules), and wherein the orientation of the optical view position axis of at least one electronic camera module of the three or more electronic camera modules is substantially non-perpendicular to an imaginary planar surface area located adjacent an optical center of the at least one electronic camera module and oriented tangential to the imaginary outer surface analog.

In embodiments, at least one local non-substantial deviation is an indentation in the three-dimensional outer surface that positions and protects one of the electronic camera modules.

Suitably, at least one of the electronic camera modules is a camera system comprising an image capturing device one or more optical elements, with one of the one or more optical elements acting as a protective front cover being substantially scratch resistant; and a mounting apparatus holding the image capturing device and the one or more optical elements.

In embodiments, the image capturing device and at least one of the one or more optical elements form a sub-assembly held together by an additional apparatus, wherein the optical element acting as a protective front cover is not included in the sub-assembly.

Suitably the mounting apparatus has shock reducing properties, and a longest outer dimension of the at least one electronic camera module has a length between about 4 mm and about 28 mm, between about 10 mm and about 24 mm, or between about 16 mm and about 20 mm.

In embodiments, the encasement comprises two or more parts interconnected at a set of mechanical interfaces to form the integral mechanical enclosure, the set of mechanical interfaces dividing up the three-dimensional outer surface, and wherein the at least one electronic camera module having the orientation substantially non-perpendicular to the imaginary planar surface area is located adjacent a mechanical interface of the set of mechanical interfaces, and is inclined in a direction toward the mechanical interface in order to rotate the optical view position axis toward the mechanical interface so that a dead view zone adjacent the mechanical interface in minimized.

Suitably, the three-dimensional outer surface of the encasement is substantially spherical.

In embodiments, an angle between the optical view position axis of the at least one electronic camera module having the orientation substantially non-perpendicular to the imaginary planar surface area and a perpendicular orientation with respect to the imaginary planar surface area is between about 1° and about 30°, or between about 2° and about 20°, or between about 3° and about 12°.

Also provided are camera assemblies for capturing a substantial portion of a spherical image, the camera assembly comprising an encasement to provide an integral mechanical enclosure for the camera assembly, the encasement comprising a three-dimensional outer surface having a substantially spherical shape an imaginary sphere analog substantially aligned in position and radius with the three-dimensional outer surface and three or more electronic camera modules positioned in the encasement, each electronic camera module having an optical view position axis, wherein the orientation of the optical view position axis of each electronic camera module is different from the orientation of the optical view position axis of any other electronic camera module, and wherein the orientation of the optical view position axis of at least one electronic camera module of the set of the three or more electronic camera modules is substantially non-parallel to an imaginary line passing through the center of the imaginary sphere analog to an optical center of the at least one electronic camera module.

Suitably, the encasement is an assembly of two or more parts interconnected by a set of mechanical interfaces to form the integral mechanical enclosure, the set of mechanical interfaces dividing up the three-dimensional outer surface; and wherein the at least one electronic camera module having the orientation substantially non-parallel to the imaginary line is located adjacent a mechanical interface of the set of mechanical interfaces and is inclined in a direction toward the mechanical interface in order to rotate the optical view position axis toward the mechanical interface so that a dead view zone adjacent the mechanical interface in minimized.

In exemplary embodiments, an angle between the optical view position axis of the at least one electronic camera module having an orientation substantially non-parallel to the imaginary line, and the imaginary line, is between about 1° and about 30°, or between about 2° and about 20°, or between about 3° and about 12°.

A distance (depth) between an optical center of each of the three or more electronic camera modules and the surface of the imaginary sphere is suitably between about 2 mm and about 15 mm, or between about 4 mm and about 12 mm, or between about 6 mm and about 10 mm.

Also provided are camera assemblies for capturing a substantial portion of a spherical image, the camera assembly comprising an encasement to provide an integral mechanical enclosure for the camera assembly, the encasement comprising a three-dimensional outer surface having substantial non-planar surface portions three or more electronic camera modules positioned in the encasement one or more electronic circuit boards one or more energy source components; and one or more electronic cable structures interconnecting the electronic circuit boards, the camera modules and the energy source components, the camera assembly having a central weight distribution.

In embodiments, the encasement has a substantially spherical shape, and an imaginary outer spherical surface analog representing an overall structural shape envelope of spherical shape, and the at least one energy source component is positioned and fixed within the encasement at the center of the imaginary outer spherical surface analog.

Also provided are camera assemblies for capturing a substantial portion of a spherical image, the camera assembly comprising an encasement to provide an integral mechanical enclosure for the camera assembly, the encasement having a three-dimensional outer surface, the three-dimensional outer surface having substantial non-planar surface portions three or more electronic camera modules positioned in the encasement, each electronic camera module having an optical view position axis, wherein the orientation of the optical view position axis of each electronic camera module is different from the orientation of the optical view position axis of any other electronic camera module, one or more active electronic circuit boards one or more energy source components; and one or more electronic cable structures interconnecting the active electronic circuit boards, the camera modules and the energy source components, wherein at least one electronic cable structure interconnects at least one electronic circuit board and at least two camera modules and has a main flat extension, and wherein the at least one electronic cable structure includes a set of conductors arranged adjacent each other in the main flat extension, the at least one electronic cable structure has at least two extension portions connecting to the at least two camera modules, each extension portion and a corresponding routing of the corresponding conductors of the set of conductors are positioned in its extension.

In embodiments, the at least one electronic cable structure is a passive printed circuit board (PCB) having substantially flexible portions.

Also provided are camera assemblies for capturing a substantial portion of a spherical image, the camera assembly comprising an encasement to provide an integral mechanical enclosure for the camera assembly, the encasement having a three-dimensional outer surface and a substantially spherical shape, the encasement comprising an assembly of two or more shell elements, the two or more shell elements interconnected with one or more mechanical interfaces to form the integral mechanical enclosure, the mechanical interfaces dividing up the three-dimensional outer surface, each mechanical interface providing a form-locking fit to spatially position two adjacent shells; and three or more electronic camera modules positioned in the encasement.

Suitably, the camera assemblies further comprise a cap element that locks the two or more shell elements in place, for example wherein the cap element is attached to the encasement via a screw.

In embodiments, the assemblies comprise three shell elements, each shell element having substantially the same shape and size so as to form the spherical shape, each shell element having 3 or up to 12 electronic camera modules and suitably further comprise fastening elements that attach at the positions of the mechanical interfaces.

Suitably, the encasement comprises an inner support and an outer support.

In embodiments, the camera module is contained in a locking element that is oriented and locked in the inner support and covered by the outer support.

Also provided are camera assemblies for capturing a substantial portion of a spherical image, the camera assembly comprising an encasement to provide an integral mechanical enclosure for the camera assembly, the encasement comprising a three-dimensional outer surface having substantial non-planar surface portions, an imaginary outer surface analog representing an overall structural shape envelope of the three-dimensional outer surface, so that one or more local non-substantial deviations of the three-dimensional outer surface from the overall structural shape envelope are not included in the imaginary outer surface analog; and three or more electronic camera modules positioned in the encasement, each electronic camera module having an optical view position axis, wherein the orientation of the optical view position axis of two or more electronic camera modules are substantially similar, and wherein the orientation of the optical view position axis of at least one electronic camera module of the three or more electronic camera modules is substantially non-perpendicular to an imaginary planar surface area located adjacent an optical center of the at least one electronic camera module and oriented tangential to the imaginary outer surface analog.

In embodiments, at least one local non-substantial deviation is an indentation in the three-dimensional outer surface that positions and protects one of the electronic camera modules. Suitably at least one of the electronic camera modules is a camera system comprising an image capturing device; one or more optical elements, with one of the one or more optical elements acting as a protective front cover being substantially scratch resistant; and a mounting apparatus holding the image capturing device and the one or more optical elements.

Suitably, the image capturing device and at least one of the one or more optical elements form a sub-assembly held together by an additional apparatus, wherein the optical element acting as a protective front cover is not included in the sub-assembly.

In embodiments the mounting apparatus has shock reducing properties.

Suitably a longest outer dimension of the at least one electronic camera module has a length between about 4 mm and about 28 mm, between about 10 mm and about 24 mm, or between about 16 mm and about 20 mm.

In embodiments, the encasement comprises two or more parts interconnected at a set of mechanical interfaces to form the integral mechanical enclosure, the set of mechanical interfaces dividing up the three-dimensional outer surface, and wherein the at least one electronic camera module having the orientation substantially non-perpendicular to the imaginary planar surface area is located adjacent a mechanical interface of the set of mechanical interfaces, and is inclined in a direction toward the mechanical interface in order to rotate the optical view position axis toward the mechanical interface so that a dead view zone adjacent the mechanical interface in minimized.

Suitably, the three-dimensional outer surface of the encasement is substantially spherical.

BRIEF DESCRIPTION OF THE DRAWINGS

FIG. 3 is a schematic representation of the integration of the acceleration before the beginning of the free fall with air resistance.

FIGS. 4A and 4B are schematics of a camera assembly as described herein.

FIGS. 5A and 5B are schematics of electronic camera modules in an encasement as described herein.

FIG. 7E shows an additional electronic camera module as described herein.

FIGS. 14D-14O show assembly connections and accessories as described herein.

DETAILED DESCRIPTION OF THE INVENTION

Figure 1:
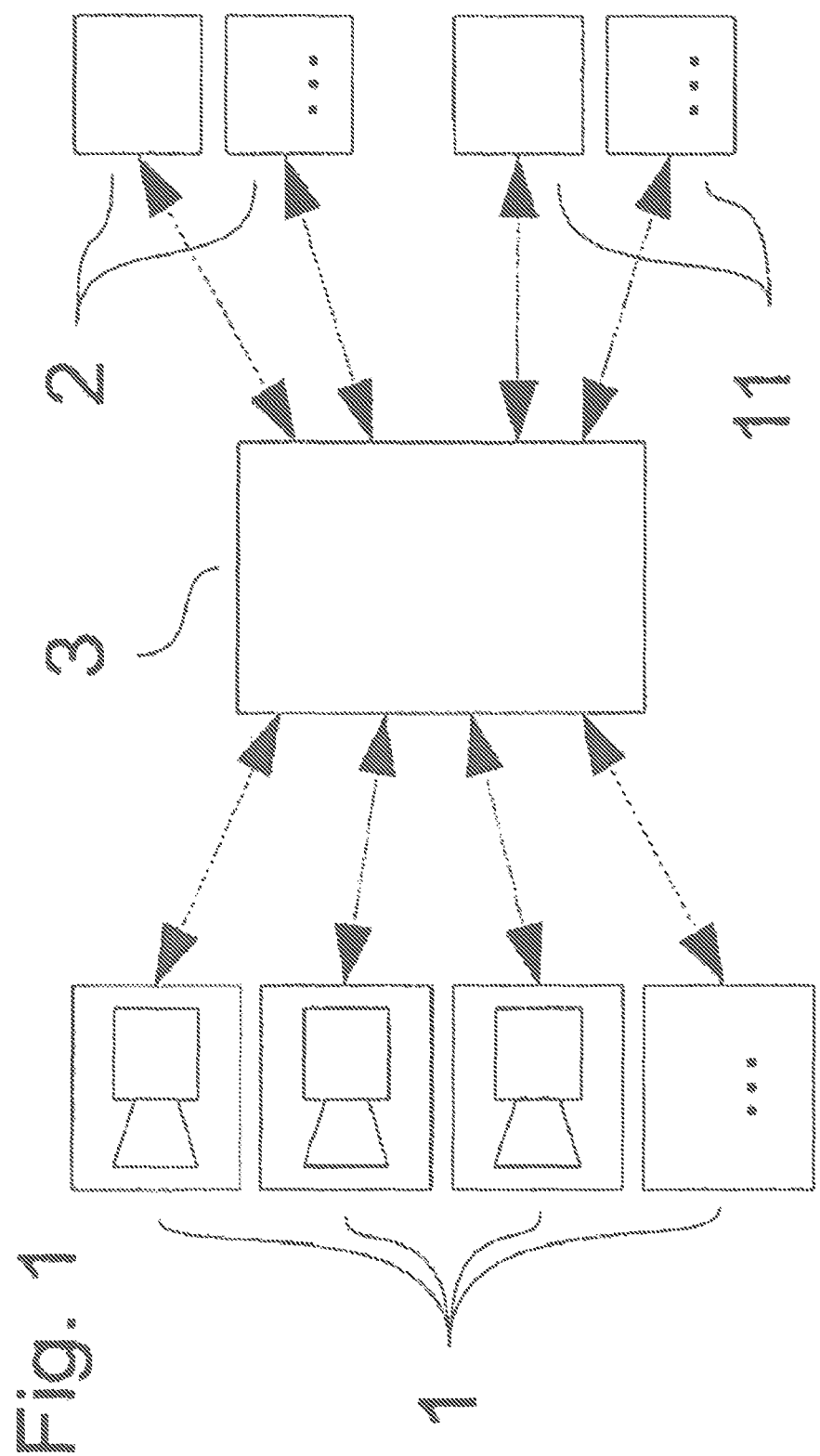
FIG. 1 is a schematic representation of a camera system according to the invention.

The objective of this invention is to provide a solution that enables each single camera to capture a good and sharp image, wherein the images can then assembled to an omnidirectional panoramic image. The solution is provided through a system of integrated cameras.

The present invention solves the problem by the features of the independent claims. Advantageous embodiments are described in the dependent claims.

The present invention solves the problem by providing the aforementioned camera system, wherein single cameras are each oriented into different directions so that they capture a composite image without gaps, wherein the composite image comprises single images of the single cameras, and wherein a central control unit is arranged, which enables registering a motion profile of the camera system by at least one sensor and determining the moment of triggering the single cameras according to a predetermined objective function, wherein the camera system moves autonomously over the entire time span. Such a camera system enables an autonomous triggering of the single cameras according to an objective function using a panoramic camera, e.g. when it is thrown into the air.

In one embodiment of the invention, the sensor is an accelerometer. This enables measuring the acceleration during throwing of a panoramic camera into the air and to using the acceleration to determine the moment of triggering the single cameras according to an objective function.

In another embodiment of the invention, the sensor is a sensor for measuring the velocity relative to the ambient air. Thus, image captures can be triggered according to an objective function which depends directly on the actual measured velocity of the camera system.

To trigger the camera system at a predetermined position it is advantageous that the objective function determines triggering the single cameras when the camera system falls short of a minimum distance d from the trigger point within the motion profile; an aspect the present invention further provides for.

In one embodiment of the invention, the camera system is preferably triggered at the apogee of a trajectory. At the apogee, the velocity of the camera system is 0 m/s. The closer the camera system triggers at this point, the slower it moves, resulting in less motion blur on the captured image.

The apogee also provides an interesting perspective, a good overview of the scenery and reduces parallax error due to smaller relative distance differences e.g. between ground and thrower.

In a further embodiment of the invention, the minimum distance d is at most 20 cm, preferably 5 cm, in particular 1 cm. If the trigger point is the apogee within a trajectory, it is advantageous that the camera system triggers as close to the point of momentary suspension as possible.

In one embodiment of the invention, the single cameras are preferably arranged that they cover a solid angle of 4 pi sr. Thus the camera system is omnidirectional and its orientation is irrelevant at the moment of image capture. Handling of the camera system is therefore easier compared with only a partial coverage of the solid angle, because the orientation is not important. In addition, the full spherical panorama allows viewing the scenery in every direction.

In another embodiment of the invention, the camera system comprises a supporting structure, and recesses in which the single cameras are arranged, wherein the recesses are designed so that a finger contact with camera lenses is unlikely to occur or impossible, wherein a padding may be attached to the exterior of the camera system. Lens pollution or damage is prevented by the recessed single cameras. Padding can both prevent the damage of the single cameras as well as the damage of the camera system as a whole. The padding can form an integral part of the supporting structure. For example, the use of a very soft material for the supporting structure of the camera system is conceivable. The padding may ensure that touching the camera lens with fingers is made difficult or impossible. A small aperture angle of the single cameras is advantageous allowing the recesses in which the single cameras are located to be narrower. However, more single cameras are needed to cover the same solid angle in comparison to single cameras with a larger aperture angle.

In yet another embodiment of the invention, the camera system is characterized in that at least 80%, preferably more than 90%, in particular 100% of the surface of the camera system form light inlets for the single cameras. When images of several single cameras are assembled ("stitching") into a composite image, parallax error is caused due to different centers of projection of the single cameras. This can only be completely avoided if the projection centers of all single cameras are located at the same point. However, for a solid angle covering 4 pi sr it can only be accomplished, if the entire surface of the camera system is used for collecting light beams. This is the case for a "glass sphere". Deviations from this principle result in a loss of light beams which pass through the surface aligning with the desired common projection center. Thus parallax errors occur. Parallax errors can be kept as small as possible, if the largest possible part of the surface of the camera system is composed of light inlets for the single cameras.

In order to align the horizon when looking at the composite image, it is expedient to determine the direction of the gravity vector relative to the camera system at the moment of image capture. Since the camera system is in free fall with air resistance during image capture, the gravity vector cannot be determined or can very difficult be determined accurately with an accelerometer. Therefore, the described camera system may apply a method in which the gravity vector is determined with an accelerometer or another orientation sensor such as a magnetic field sensor before the camera system is in flight phase. The accelerometer or orientation sensor is preferably working in a 3-axis mode.

The change in orientation between the moment in which the gravity vector is determined and the moment in which an image is captured can be determined using a rotation rate sensor, or another sensor that measures the rotation of the camera system. The gravity vector in relation to the camera system at the moment of image capture can be easily calculated if the change in orientation is known. With a sufficiently accurate and high resolution accelerometer it may also be possible to determine the gravity vector at the moment of image capture with sufficient accuracy for viewing the composite image based on the acceleration influenced by air friction and determined by the accelerometer, provided that the trajectory is almost vertical.

In a further embodiment of the invention, the camera system comprises at least one rotation rate sensor, wherein the central control unit prevents triggering of the single cameras if the camera system exceeds a certain rotation rate r, wherein the rotation rate r is calculable from the desired maximum blur and used exposure time. In little illuminated sceneries or less sensitive single cameras, it may be useful to pass the camera system several times into the air (eg, to throw) and only trigger in case the system does not spin strongly. The maximum rotation rate to avoid a certain motion blur can be calculated by the exposure time applied. The tolerated blur can be set and the camera system can be passed several times into the air until one remains below the calculated rotation rate. A (ball-shaped) camera system can easily be thrown into the air repeatedly, which increases the chance of a sharp image over a single toss.

At first, the luminance in the different directions must be measured for setting the exposure. Either dedicated light sensors (such as photodiodes) or the single cameras themselves can be used. These dedicated exposure sensors that are installed in the camera system in addition to the single cameras should cover the largest possible solid angle, ideally the solid angle of 4 pi sr. If the single cameras are used, one option is to use the built-in system of the single cameras for determining exposure and transferring the results (for example in the form of exposure time and/or aperture) to the control unit.

Another option is to take a series of exposures with the single cameras (e.g. different exposure times with the same aperture) and to transfer these images to the control unit. The control unit can determine the luminance from different directions based on the transferred data and calculate exposure values for the single cameras. For example, a uniform global exposure may be aimed at or different exposure values for different directions may be used. Different exposure values can be useful to avoid local over- or underexposure. A gradual transition between light and dark exposure can be sought based on the collected exposure data.

Once the exposure values are calculated (exposure time and/or aperture, depending on the single cameras used), they are transmitted to the single cameras. The measurement of the exposure and the triggering of the single camera for the actual photo can be done either during the same flight or in successive flights. If the measurement of the exposure and triggering for the actual photo is made in different flights, it may be necessary to measure the rotation of the camera between these events and to adjust the exposure values accordingly, in order to trigger with a correct exposure in the correct direction.

Furthermore, the above problem is solved through a method of capturing images using a camera system of the type described above. The invention therefore also provides a method characterized in that the moment of triggering for the single cameras is determined by integrating the acceleration in time before entry into free fall with air resistance, and that the triggering of the single cameras occur after falling short from a minimum distance to the trigger point within the trajectory, or upon detection of the free fall with air resistance, or upon a change of the direction of the air resistance at the transition from the rise to the descent profile, or upon drop of the relative velocity to the ambient air below at least 2 m/s, preferably below 1 m/s, in particular below 0.5 m/s, wherein either an image comprising at least a single image is captured by the single cameras or a time series of images each comprising at least one single image is captured by the single cameras, and the control unit evaluates the images in dependence on the content of the images and only one image is selected.

The state of free fall with air resistance of a camera system transferred into the air (tossed, shot, thrown, etc.) occurs when no external force is applied apart from gravity and air resistance. This applies to a thrown system as soon as the system has left the hand. In this state, an accelerometer will only detect acceleration due to air resistance alone. Therefore, it is appropriate to use the acceleration measured before the beginning of the free fall in order to determine the trajectory. By integrating this acceleration, the initial velocity of flight and the ascending time to a trigger point can be calculated. The triggering can then be performed after expiration of the ascending time.

Another possibility is to evaluate the acceleration measured during ascent and descent due to air resistance. The acceleration vector depends on the actual velocity and direction of flight. The current position in the trajectory can be concluded from evaluating the time course of the acceleration vector. For example, one can thereby realize triggering at the apogee of a flight.

The actual position in the trajectory can also be concluded from measuring the relative velocity to the ambient air directly; and the camera system can trigger e.g. if it falls short of a certain velocity.

When triggered, the camera system can capture either a single image (consisting of the individual images of the single cameras), or a series of images, for example, captured in uniform time intervals.

In this context it may also be useful to start triggering a series of image capture events directly after detecting free fall with air resistance, for example by an accelerometer.

In one embodiment of the invention the image is selected from the time series of images by calculating the current position of the camera system from the images, or by the sharpness of the images, or by the size of the compressed images.

By analyzing the image data of a series of images, it is possible to calculate the motion profile of the camera system. This can be used to select an image from the series of images. For example, the image captured when the camera system was closest to the apogee of the flight can be selected.

According to the invention it is particularly useful that the single cameras are synchronized with each other so that they all trigger at the same time. The synchronization ensures that the single images match both locally and temporally.

To produce good and sharp images single cameras with integrated image stabilization can be used in the camera system. These can work for example with motile piezo-driven image sensors. For cost savings and/or lower energy consumption it may be expedient to use the sensors connected to the control unit, in particular the rotation rate sensors, for determining control signals for image stabilization systems of the single cameras. Thus, these sensors do not have to be present in the single cameras and the single cameras can remain turned off for a longer time.

Further, the sharpness of the images can be analyzed to directly select a picture with as little motion blur as possible. The consideration of the size of compressed images can lead to a similar result because sharper images contain more information and therefore take up more space in the data storage at the same compression rate.

According to one embodiment of the invention, once the rotational rate r is exceeded (wherein the rotational rate r can be calculated from the exposure time and the desired maximum motion blur), the triggering of the single cameras is suppressed or images are buffered from a plurality of successive flights and the control unit controls the selection of only one of these images, wherein the image is selected based on the blur calculated from the image content, or based on the measured rotational rate r, or based on the blur calculated from its measured rotational rate r and the used exposure time. Thus, a user can simply throw the system repeatedly into the air and obtains a sharp image with high probability.

To obtain a single sharp image with as little motion blur as possible by repeatedly throwing the camera system into the air, two basic approaches are possible. Either the camera system triggers only below a certain rotation rate r and indicates image capturing visually or acoustically, or images of several flights are buffered and the image with the least blur is selected from this set of images.

If triggering is suppressed when exceeding a rotational rate r, this rate of rotation can be either chosen manually or calculated. It can be calculated from a fixed or user-selected maximum motion blur and the exposure time applied. For the calculation one can consider as how many pixels would be exposed by a point light source during exposure.

In the case of buffering, the control unit decides on the end of a flight series. This decision may be made due to a temporal interval (e.g. no flight/toss over several seconds) or by user interaction, such as pressing a button. For selection of the image from the series of images several methods are possible. First, the blur caused by the rotation can be determined from the image contents using image processing and the sharpest image can be selected. Second, the measured rotational rate r can be used, and the image with the lowest rotation rate r can be selected. Third, the blur from the measured rotational rate r and applied exposure time can be calculated to select the sharpest image.

In case of exceeding the rotation rate r, another possibility is to buffer the images of several successive flights and select the sharpest image. The selection of the sharpest image can either be based on the contents of the images, or on the rotational rate measured. If it is done by the rotation rate measured, an acceptable maximum rotation rate m can be calculated using a preset upper maximum motion blur and the exposure time applied. If there is no image in a series below a preset maximum motion blur or below the upper acceptable maximum rotational rate m, it is also possible that none of the images is selected. This gives the user the opportunity to directly retry taking pictures. It is also possible to trigger image capture events in a series only when the measured rotational rate is below the maximum acceptable upper rotational rate m.

Further, it is intended to reduce the occurrence of blurred images by influencing the rotation of the camera system. To slow down and at best stop the rotation of the camera system at the apex a self-rotation detector and a compensator for the rotation of the camera system can be included. Known active and passive methods can be employed to slow down the rotation.

In the active methods the control system uses a control with or without feedback. For example, reaction wheels use three orthogonal wheels, which are accelerated from a resting position in opposite direction to the ball rotation about each of the respective axis. When using compressed air from a reservoir e.g. 4 nozzles are mounted in the form of a cross at a position outside of the ball and two further nozzles attached perpendicular to the 4 nozzles on the surface of the camera system. Electrically controllable valves and hoses connected to the nozzles are controlled by comparison with data from the rotational rate sensor.

Further, to slow down the rotation of the camera system moving weights which upon activation increase the ball's moment of inertia can be employed.

As a passive method, it would be appropriate to attach e.g. wings or tail feathers outside of the camera system as aerodynamically effective elements.

Another method employs a liquid, a granule, or a solid body, each in a container, in tubes or in a cardanic suspension. These elements would dampen the rotation due to friction.

The above mentioned and claimed and in the exemplary embodiments described components to be used in accordance to the invention are not subject to exceptions with respect to their size, shape, design, material selection and technical concepts so that selection criteria well-known in the art can be applied without restriction.

Further details, features and advantages of the invention's object emerge from the dependent claims and from the following description of the accompanying drawings in which a preferred embodiment of the invention is presented.

The present invention will now be described more fully hereinafter with reference to the accompanying drawings, which illustrate embodiments of the present invention. This invention may, however, be embodied in many different forms and should not be construed as limited to the illustrated embodiments set forth herein. Rather, these embodiments are provided so that this disclosure will be thorough and complete, and will fully convey the scope of the present invention to those skilled in the art. Like numbers refer to like elements throughout. The prime notation, if used, indicates similar elements in alternative embodiments.

Figure 2:
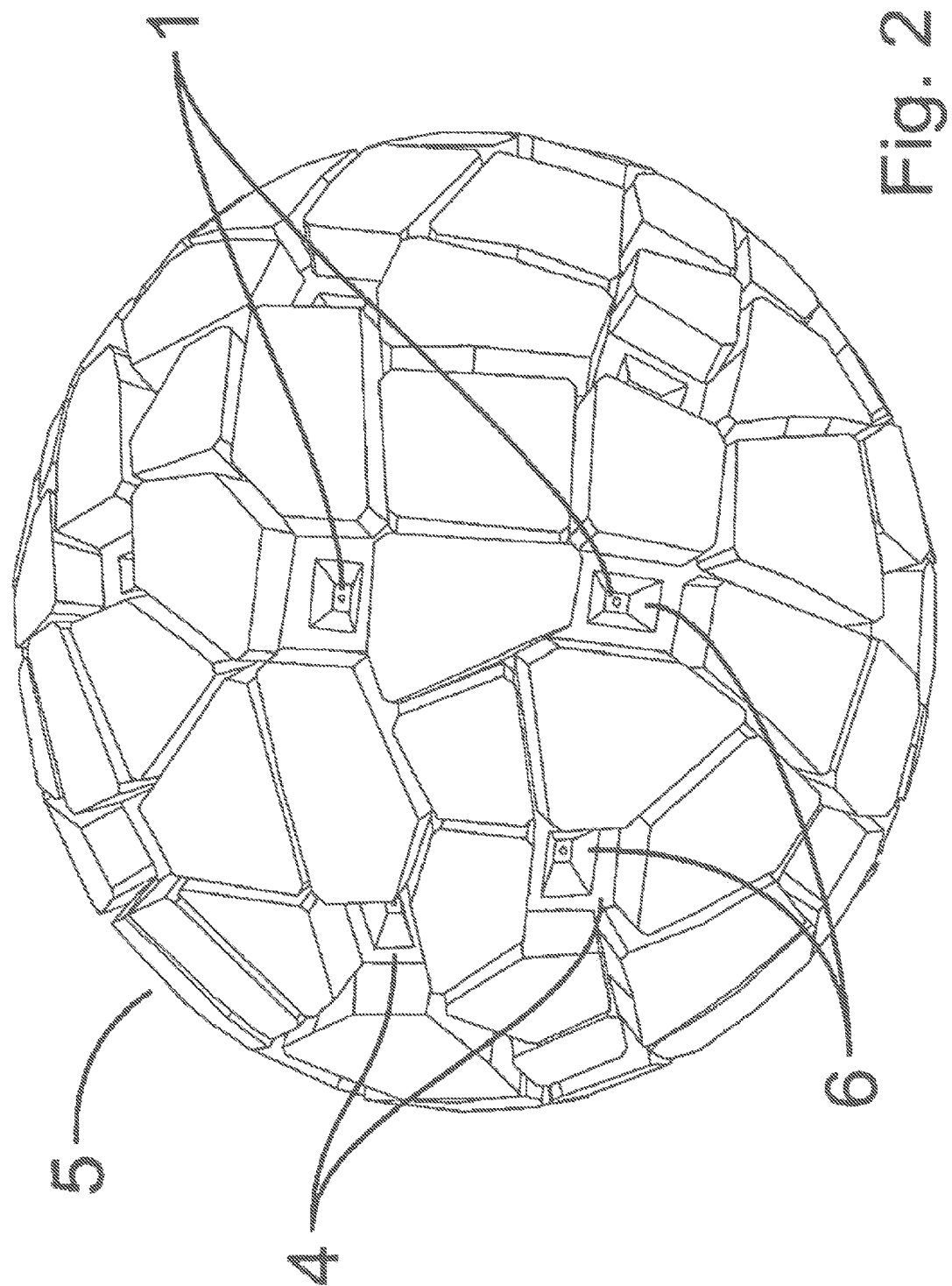
FIG. 2 is a perspective view of a camera system according to the invention.

The embodiment according to FIGS. 1, 2 and 3 represent a camera system for capturing full spherical panoramas, which is thrown into the air. It is called Throwable Panoramic Ball Camera, and described below.

The camera system according to the invention consists of a spherical supporting structure 4, for example a ball, with 36 mobile phone camera modules 1 and the necessary electronics inside. The camera modules 1 are arranged on the surface of said spherical supporting structure 4 so as to cover the entire solid angle of 4 pi sr. That is, the camera modules 1 cover the entire solid angle with their view volume. The camera system is cast vertically into the air by the user and the camera system is given an acceleration 7 upon launch, which is detectable by an accelerometer 2 arranged in the camera system. After integrating the acceleration 7, and determining the velocity, the moment of reaching of the apex is determined. Upon reaching the apex the mobile phone camera modules 1 simultaneously each trigger an image capture.

This happens when the ball is moving very slowly. The images of the cameras are composed to a composite image according to existing methods for panoramic photography.

The construction of the camera can be further described as follows. The camera system comprises 36 mobile phone camera modules 1 each buffering image data after capturing in a First-In-First-Out RAM IC (FIFO RAM-IC). The mobile phone camera modules 1 and the FIFO-RAM-ICs are mounted on small circuit boards below the surface of the ball to a supporting structure 4. A motherboard with a central microcontroller and other components that make up the control unit 3 is located inside the supporting structure 4. The mobile phone camera modules 1 are connected via a bus to the central microcontroller. This transfers the image data via a connected USB cable to a PC after the flight.

The flight of the camera system can be divided into four phases: 1. Rest, 2. Launch, 3 Flight, 4 Collection. In phase 1, the sensor 2 measures only acceleration of gravity, while in phase 2, the acceleration due to gravity plus the launch acceleration 7 is measured by sensor 2. The beginning of the launch phase 8 and the end of the launch phase 9 is shown in FIG. 3. During Phase 3, i.e. the flight phase, no or only a very little acceleration is measured by sensor 2, because the sensor's test mass descends (and ascends) as fast as the camera system. In phase 4, inertia by capture adds to the acceleration of gravity.

Since the measured acceleration 7 during the flight at the end of the launch phase 9 is approximately 0 m/s$^2$, the apex is best determined indirectly through the launch velocity. Therefore, the microcontroller constantly caches the last n acceleration values in a first-in-first-out (FIFO) buffer. The flight phase is reached when the measured acceleration falls below the threshold value of 0.3 g for 100 ms.

To determine the launch phase, the FIFO is accessed in reverse order. In this case, the end of the launch phase 9 is detected first as soon as the acceleration increases to a value over 1.3 g. Then, the FIFO is read further in reverse until the acceleration 7 drops below 1.2 g. The launch velocity can now be determined by integrating the acceleration 7 between these two time points in the FIFO, wherein the acceleration by gravity is subtracted. The integrated surface 10 is shown in FIG. 3. The ascending time to the apex is calculated directly from the velocity while taking into account air resistance.

The mobile phone camera modules 1 are triggered by a timer in the microcontroller of the control unit 3, which starts upon detection of free fall with air resistance after the ascending phase. The individual trigger delays of the mobile phone camera modules 1 are considered and subtracted from the ascending phase as correction factors. Furthermore, 100 ms are subtracted after which the free fall is detected as described above.

For the camera system according to the invention, a module which is as small as possible of a mobile phone camera is used as a mobile phone camera module 1 with fixed focus. In this type of lens, the entire scene is captured sharply above a certain distance and does not require time for focusing. Most mobile phone cameras have relatively low opening angles, so that more mobile phone camera modules are required in total. However, this causes the recesses 6 on the surface and supporting structure 4 of the camera system to remain narrow. This makes unintended touching of the lenses when throwing less likely. Advantageously, in the camera system, the direct compression of the JPEG image data is managed by hardware. This allows that many images are cached in the FIFO and subsequent transfer to the PC is fast.

For enabling throwing the camera system, the spherical supporting structure 4 needs to be kept small. Therefore, it is necessary to minimize the number of mobile phone camera modules 1 to be arranged so that the entire solid angle is covered. This is why the position of the mobile camera modules 1 on the surface of the supporting structure 4 was optimized numerically. For this purpose, an optimization algorithm was implemented, which works on the principle of hill climbing with random restart and the result is subsequently improved by simulated annealing.

The virtual cameras are placed with their projection centers in the center of a unit sphere to cover a part of spherical surface by their view volumes. Thus, the coverage of the solid angle by the camera modules for a given combination of camera orientations can be evaluated by checking the uniformly distributed test points on the sphere surface. As cost function, the number of test points is used, which are not covered by a virtual camera. The algorithm minimizes this cost function.

To be able to practically implement the computed camera orientations, it is useful to manufacture the supporting structure 4 by rapid prototyping. The supporting structure 4 was manufactured by selective laser sintering of PA 2200 material.

Holes in the supporting structure 4 are provided for better air cooling of electronics. To this shell suspensions are mounted inside for attaching the circuit boards of the mobile phone camera modules 1. In addition, suspensions are available for the motherboard and the battery. The sphere is divided into two halves, which are joined together by screws. In addition to the holes for the camera lenses, gaps for the USB cable and the on/off switch are present. Points for attachment of ropes and rods are also provided. The suspension for the camera boards should allow accurate positioning of the mobile phone camera modules 1 at the calculated orientations. It is important that by throwing the camera system, no change in position occurs. To ensure this, arresters were mounted on two sides of the suspension and springs on each opposite sides. The springs were realized directly by the elastic material PA 2200.

In addition, a clip fastened on both sides with a hook pushes the circuit board toward the outside of the supporting structure 4. The arrest in this direction consists of several small protrusions positioned on free spots on the board. On this side there is also a channel that directs the light from an LED to the outside.

Every mobile phone camera module 1 is mounted behind a recess in the surface of the camera system. This recess is adapted to the shape of the view volume of the mobile phone camera module 1. It has therefore the shape of a truncated pyramid. In this recess positioned on one side is the outlet of the LED channel and on the other side, recessed during laser sintering, the number of mobile phone camera modules 1. When using the camera system, it is very difficult to touch camera lenses with fingers due to the shape and size of the recesses, protecting these from damage and dirt.

As a shock absorber in case of accidental dropping and to increase grip, foam is glued to the outside of the supporting structure 4, which forms a padding 5. A closed cell cross-linked polyethylene foam with a density of 33 kg/m$^3$ is applied, which is available commercially under the brand name "Plastazote® LD33".

FIG. 2 shows the exterior view of the camera system with padding 5, the supporting structure 4, the recesses 6 and the mobile phone camera modules 1.

Every mobile phone camera module 1 is positioned on a small board. All camera boards are connected by one long ribbon cable to the motherboard. This cable transfers both data to the motherboard via a parallel bus and the control commands via a serial bus to the camera boards. The mainboard provides each of the camera boards via power cables with required voltages.

The mainboard itself hosts the central microcontroller, a USB-IC, a bluetooth module, the power supply, the battery protection circuit, a microSD socket, an A/D converter, an accelerometer, and rotational rate sensors.

On the camera board located next to the VS6724 camera module is a AL460 FIFO IC for the temporary storage of data and a ATtiny24 microcontroller. The camera module is mounted in the center of a 19.2 mm×25.5 mm×1.6 mm size board on a base plate. This is exactly in the middle of the symmetrical board to simplify the orientation in the design of the supporting structure 4. The FIFO-IC is placed on the flip side, so that the total size of the board only insignificantly exceeds the dimensions of the FIFO-ICs. A microcontroller handles the communication with the motherboard and controls FIFO and camera.

In the following, embodiments of the invention are listed which seem in particular advantageous:

A camera system for capturing images consisting of at least one single camera, a control unit and sensors characterized in that the single cameras (1) are each oriented into different directions on a supporting structure (4) so that they capture a seamless composite image, wherein the composite image comprises single images of the single cameras (1), a central control unit (3) is arranged, which enables registering a motion profile of the camera system by at least one sensor (2) and determining the moments of triggering the single cameras (1) according to a predetermined objective function, and detector of the self-rotation are included, wherein the camera system moves autonomously over the entire time span.

The camera system as described above, characterized in that the sensor (2) is an accelerometer.

The camera system as described above, characterized in that a further sensor (2) is a sensor for measuring the velocity relative to the ambient air.

The camera system as described above, characterized in that a further sensor (2) is a rotation rate sensor.

The camera system as described above, characterized in that a further sensor (2) is an exposure sensor.

The camera system as described above, characterized in that a further sensor (2) is an orientation sensor.

The camera system as described above, characterized in that the objective function determines triggering the single cameras (1) when the camera system falls short of a minimum distance d from the trigger point within the trajectory.

The camera system as described above, characterized in that the minimum distance d is at most 20 cm, preferably 5 cm, especially 1 cm.

The camera system as described above, characterized in that the trigger point is the apogee of the trajectory.

The camera system as described above, characterized in that the single cameras are arranged so that they cover a solid angle of 4 pi sr.

The camera system as described above, characterized in that, a padding (5) is mounted to the outside of the supporting structure (4).

The camera system as described above, characterized in that the supporting structure (4) of the camera system comprises openings for taking up of the single cameras (1) and the padding (5) has recesses (6) as light inlets for the single cameras (1).

The camera system as described above, characterized in that at least 80%, preferably more than 90%, in particular 100% of the surface of the camera system forms light inlets for the single cameras.

The camera system as described above, characterized in that the camera system has actuatory components (11) at the supporting structure (4) to compensate for the self-rotation.

A method of capturing images using a camera system comprising at least a single camera (1), at least a control unit (3) and at least a sensor (2), in particular an accelerometer, characterized in that
    the camera system is propelled by an initial acceleration to a starting velocity
    at the beginning of free flight a trigger criterion is activated, upon meeting the trigger criterion, the single cameras (1) are triggered, wherein an image comprising at least a single image is captured by the single cameras (1).

A method of capturing images using a camera system comprising at least a single camera (1), at least a control unit (3) and at least a sensor (2), in particular an accelerometer, characterized in that
the camera system is propelled by an initial acceleration to a starting velocity,
at the beginning of free flight a trigger criterion is activated,
upon meeting the trigger criterion, the single cameras (1) are triggered, wherein an time series of images each comprising at least a single image are captures by the single cameras (1).

A method as described above, characterized in that an image evaluation and selection by the control unit (3) occur depending on the content of the images.

A method as described above, characterized in that an image evaluation and selection by the control unit (3) occur by the measured values of the sensors (2).

A method as described above, characterized in that the triggering criterion is determined as a trigger point within the trajectory by integrating the acceleration in time before entry into free fall with air resistance, and that the triggering of the single cameras occur after falling short from a minimum distance d to the trigger point.

A method as described above, characterized in that the triggering criterion is determined by the evaluation of the acceleration measured during ascent and descent due to air resistance.

A method as described above, characterized in that the triggering criterion is determined by a drop of the velocity relative to the ambient air below at least 2 m/s, preferably below 1 m/s, in particular below 0.5 m/s A method as described above, characterized in that the selection of the image from the time series of images is done by calculating of the current position of the camera system from the images.

A method as described above, characterized in that the selection of the image from the time series of images is done by the sharpness of the images.

A method as described above, characterized in that the selection of the image from the time series of images is done by the size of the compressed images.

A method as described above, characterized in that the single cameras are synchronized with each other so that they all trigger at the same time.

A method as described above, characterized in that a maximum motion blur is defined and that a maximum rotational rate r is calculated using the exposure time applied, and that the triggering of the single cameras (1) is controlled by comparing the values of the rotation rate sensor to the maximum rotational rate r by the control unit (3).

A method as described above, characterized in that the triggering of the single cameras does not occur when the rotational rate r is exceeded.

A method as described above, characterized in that upon exceeding the rotation rate r, images of a plurality of successive flights are buffered and only one of the images are selected by the control unit (3) using an upper maximum rotation rate m and the rotation rate measured, wherein the maximum rotation rate m is calculated from a predetermined upper maximum motion blur and the exposure time applied.

A method as described above, characterized in that the central control unit (3) acquires exposure-related data from the existing sensors (2) or arranged single cameras (1) with the beginning of the flight, determines matching exposure settings for the single cameras (1) and sends these to the single cameras (1) and the single cameras (1) at the trigger time use the exposure settings from the control unit (3) instead of local settings for single image capture.

A method as described above, characterized in that the central control unit (3) acquires focusing-related data from the existing sensors (2) or arranged single cameras (1) with the beginning of the flight, determines matching focusing settings for the single cameras (1) and sends these to the single cameras (1) and the single cameras (1) at the trigger time use focus settings from the control unit (3) instead of local settings for single image capture.

A method as described above, characterized in that the central control unit (3) before the beginning of the flight determines the direction of the gravity vector relative to the camera using the orientation sensor (2), determines the orientation change between the time of this measurement and the trigger point, and determines the gravity vector at the moment of triggering using the gravity vector determined before the beginning of the flight and the change in orientation.

In another embodiment of the present invention the housing of the camera system is shock-proof and consists of components of different materials arranged in layers. The different layers are assigned to different functions. The outer layer is for example scratch-resistant, highly-flexible, and to certain degree unbreakable, or any combination thereof. In a further exemplary embodiment the outer layer distributes force to a larger area if impact occurs on small area. An inner layer is, for example, shock-absorbent. The most inner layer provides a ridged frame to arrange the electronic components. This inner layer, for example, orients the individual camera modules correctly.

The outer layer is, for example, made of plastics (especially a Polymer with good mechanical properties, especially engineering plastic, particularly Polycarbonate, ABS, POM, PA, PTFE, PMMA and/or a blend thereof) and/or metal, (especially steel, aluminium and/or magnesium), or any combination thereof. The shock-absorbent layer is, for example, made of foam material (especially flexible foam, in particularly Polyurethane foam, Polyethylene foam, Polypropylene foam, Expanded EVA and/or Expanded PVC) and/or cork or any combination thereof. The most inner layer is, for example made of plastics (especially commodity plastics, particularly ABS, Polyethylene, Polypropylene, PVC and/or a blend thereof), and/or metal (especially steel, aluminium and/or magnesium), or any combination thereof.

In an further exemplary embodiment the outer layer has a thickness of 1 mm to 10 mm. In just another exemplary embodiment the thickness is 3 mm.

In an further exemplary embodiment the shock-absorbent layer has a thickness of 2 mm to 20 mm. In just another exemplary embodiment the thickness is 6 mm. In just another exemplary embodiment the shock-absorbent layer is made of PU microcellular foam, closed cell 1.05.

In an further exemplary embodiment the most inner layer has a thickness of 0.5 mm to 5 mm. In just another exemplary embodiment the thickness is 1.5 mm.

In another embodiment, the layers are arranged as a sandwich of three or more layers, consisting of at least one shock-absorbent layer, at least one outer layer, and at least one most inner layer. The layers in this sandwich can, in an exemplary embodiment, be arranged that at least one outer layer and at least one most inner layer have no rigid connection.

In another embodiment of the present invention the housing of the camera system presents itself in a transparent/brittle lock, to cause users to handle the camera system with care. For that, in an exemplary embodiment, at least the outer layer is transparent or semi-transparent. In just another exemplary embodiment, the outer surface has a mirroring or semi-mirroring feature, which can be implemented, for example by a thin coating, for example, the coating material may consist of silver.

In another embodiment of the present invention the outer layer of the housing is integral with the transparent windows to enable the view of the individual camera modules of the camera system. The window areas or the entire outer layer of the housing is, for example coated with an anti-glare surface material. In a further exemplary embodiment, the widows are not just flat, but shaped as lenses, integral with the outer layer of the housing.

In another embodiment of the present invention, the camera system includes a USB connector, to transfer image data to an external device, for example a PC. The camera system may include a stick or stand that connects into a socket that incorporates the USB connector to thereby enable charging, control and/or transmission of image data through the stick or stand. In a further embodiment the camera system may include a device with an embedded shutter button that connects to the before described socket and triggers the camera using the USB connection integrated into the socket. In just another exemplary embodiment this device is a stick with the shutter button built into the handle.

In another embodiment of the present invention, the camera system includes a throwable camera and a device to accelerate and throw the throwable camera with minimal rotation. In an exemplary embodiment, three elastic strings are connected to each other in a hub that has a stick portion that connects into the throw-able camera. When the sides of the elastic strings opposite to the hub are affixed, so that the arrangement of affixation can be described as a mainly horizontal triangle, such in a way that the elastic strings are elongated, the user can further deflect the position of the throwable camera mainly vertically down, suddenly release the strings in combination with the throw-able camera so that the elastic strings spring back, and release and throw the throwable camera mainly vertically up, with minimal rotation.

In another embodiment of the present invention, the device to accelerate and throw the throw-able camera includes pneumatic cylinders or coil springs, or any combination thereof. In an exemplary embodiment, the pneumatic cylinders and/or the spring coils are use the storage energy, so that a trigger component, integrated to such device, is releasing the energy to throw the throw-able camera, when operated by a user.

In another embodiment of the present invention, the housing of the camera system, includes markers like colored stripes that assist the user to find the aforementioned USB connector, a button and/or to provide the user feedback about the rotation of the camera system when hand-held and thrown by the user. In just another exemplary embodiment the stripes narrow from one side to the other with a button on one side and the USB connector on the other, enabling the user to easily locate each element. In another embodiment this button may act as a shutter button and/or on-off-button.

In another embodiment of the present invention, the camera system is able to capture a substantial portion of a spherical image, the capturing being triggered adjacent the highest point of a free, non-propelled trajectory, comprising:

two or more camera modules, the two or more camera modules being oriented with respect to in each such camera module optical main axis in two or more directions different to each other, at least one control unit that connects to the two or more camera modules, and a sensor system including an accelerometer, further characterized that no position detector is included.

In an exemplary embodiment the substantial portion of a spherical image covers a solid angle of at least 1 Pi (Π) sr, especially 2 Pi sr, preferably 4 Pi sr.

In just one exemplary embodiment the two or more camera modules are embedded in, a for example spherical, enclosure. In just another exemplary embodiment the camera modules are of fixed focus type, for example modules typically used in mobile phones.

Suitably, no position detector is included because it is sufficient to know when the camera is moving the least during the free, non-propelled trajectory, not its absolute position. In just a further exemplary embodiment the free, non-propelled trajectory is a result of the camera being thrown into the air.

In a further embodiment at least two of the two or more camera modules of the camera system are optically oriented to generate overlapping images, when the field of view is located in a significant distance to the camera module. In another exemplary embodiment the significant distance is defined by a range of 20 cm or more. In just another exemplary embodiment the amount of overlap of the overlapping images is at least 10% of the one of the overlapping images.

As the camera modules do not necessarily have the same projection centers gaps in the coverage of surrounding space is inevitable. Overlap has therefore to be defined at a certain distance.

In a further embodiment the connection between the at least one control unit and the two or more camera modules is of electrical nature.

In a further embodiment of the present invention a method for capturing a substantial portion of a spherical image adjacent the highest point of a free, non-propelled trajectory of a camera system is used, the method comprising the steps of:

receive by a control units that connects to at least two camera modules and at least one acceleration sensor absolute acceleration data, the two or more camera modules being oriented with respect to in each such camera module optical main axis in two or more directions different to each other, derive from the absolute acceleration data differential acceleration data, integrate substantial vertical components of the differential acceleration data over a period of time to thereby derive integrated acceleration data, derive from the integrated acceleration data a point in time to trigger the image capture, and trigger the image capture at the point in time derived from the integrated acceleration data.

The term absolute acceleration data refers to the raw data as generated by the acceleration sensor. The term differential acceleration data refers to sensor data where the acceleration component caused by earth acceleration is removed. In just an exemplary embodiment the differential acceleration data can, for example be generated from the absolute acceleration data by subtracting a vector of approximately 1 g magnitude resulting from earths acceleration while the camera is supported, for example by a human hand.

In an exemplary embodiment the integration of the substantial vertical components of the differential acceleration data relies on recording the acceleration due to earth's gravity prior to the start of a free, non-propelled trajectory. In a further exemplary embodiment the integration of the substantial vertical components of the differential acceleration data relies on recording the acceleration due to earth's gravity prior to the start of the acceleration phase that precedes a free, non-propelled trajectory.

In a further embodiment the method further comprises the step of transferring the image data from the two or more camera modules into a separate memory unit. In another exemplary embodiment the method further comprises the step of conditioning the image data stored in the separate memory unit for transfer to an external system either through a USB connection and/or a wireless connection. In just another exemplary embodiment the conditioning of the image data stored in the separate memory unit includes the compression of the image data with a compression algorithm, for example JPEG, PNG and/or ZIP.

In a further embodiment the period of time integrating substantial vertical components of the differential acceleration data starts when the differential acceleration data is substantially different from zero. In another exemplary embodiment the magnitude of the differential acceleration data is more than 0.2 g for a time of more than 10 ms. In another exemplary embodiment the period of time integrating substantial vertical components of the differential acceleration data ends when the absolute acceleration data is substantially similar to zero. In just another exemplary embodiment the magnitude of the absolute acceleration data is less than 0.1 g for a time of more than 10 ms.

In just an exemplary embodiment the integration of the substantial vertical components works by continually processing the data, integrating the data by adding up distinct measurements of substantial vertical components and multiplying them by the time difference between the distinct measurement points.

In a further embodiment of the present invention a method for capturing a substantial portion of a spherical image adjacent the highest point of a free, non-propelled trajectory of a camera system, the method comprises the steps of:
 receive by a control unit that connects to at least two camera modules light exposure data that correlate to a spatial orientation, the two or more camera modules being oriented with respect to in each such camera modules optical main axis in two or more directions different to each other,
 receive by the control unit data that represent the rotation of the camera system,
 derive exposure control data from the light exposure data that correlates the orientation of the light exposure data with the data that represents the rotation of the camera system,
 transfer the exposure control data to each camera module, and
 trigger the image capture of the camera modules.

In a further embodiment the camera contains camera modules that cover the whole sphere and that allow an image without gaps. In just another embodiment the camera contains additional exposure sensors that allow measuring the light exposure data which is processed by the control unit and used later for setting the exposure control data of the camera modules. In just another embodiment the light exposure data is derived from image data received from the at least two camera modules.

In just another exemplary embodiment the control unit contains a rotational sensor for determining the relative rotation of the camera system. In just another exemplary embodiment the control unit comprises at least one acceleration sensors that can be used to calculate the relative position in the trajectory and/or the relative rotation during the trajectory. In another exemplary embodiment the exposure control data is transferred by electrical wire and by another exemplary embodiment the exposure control data is transferred wirelessly to the camera modules.

In a further embodiment the deriving of the exposure control data from the light exposure data is implemented by rotating the light exposure data by the amount of rotation of the camera system between the reception of the light exposure data and the triggering of the image capture of the camera modules.

In a just another embodiment while the camera moves along its trajectory the exposure control data for each camera change according to its relative position on the path and its current rotation. To make sure that the cameras have correct exposure control data set when the image is triggered the rotation is measured by for example a rotational sensor or multiple accelerometers. The relative motion of the camera can also be determined by using accelerometer data from the launch. The exposure control data for the cameras at the moment of the triggering are derived by the light exposure data and the knowledge about the movement and rotation of the camera.

In another exemplary embodiment after rotating the light exposure data this light exposure data is mapped onto the camera modules.

In yet another exemplary embodiment the light exposure data is used to create a map of the exposure data. In just another exemplary embodiment this map can be a spherical, cubical or a polygon shaped map. The map is then used to provide the camera modules with the exposure control data to set the right exposure values.

In just another exemplary embodiment the mapping of the light exposure data onto the camera modules is performed using a nearest neighbor algorithm.

In just another exemplary embodiment the mapping of the light exposure data onto the camera modules is performed by first calculating intermediate exposure data points and then mapping said intermediate exposure data points onto the camera modules.

In just another exemplary embodiment the calculation of the intermediate exposure data points is done by the use of a nearest neighbor algorithm that finds the nearest neighbors to a certain intermediate exposure data point for estimating the exposure control data for this particular point. The light exposure data of the nearest neighbors is then used to calculate the exposure control data value according to a function that combines these values, for example the average or any other method known in the art.

In another exemplary embodiment the calculation of the intermediate exposure data points is implemented by using a bilinear interpolation, bicubic interpolation, average, median, k-nearest neighbor and/or weighted k-nearest neighbor algorithm.

In an exemplary embodiment to estimate one intermediate exposure data point four cameras that were closest to that point transformed by the inverse rotation of the camera system are detected using a k-nearest neighbor algorithm. Using the light exposure data of these cameras an interpolation technique known to the art like bilinear, bicubic interpolation and/or spline interpolation can be used to determine the value for the single intermediate exposure data point.

In just another exemplary embodiment the light exposure data of the cameras does not form a regular grid. This has to be reflected in the coefficients of the interpolation method used.

In additional embodiments, provided herein are camera assemblies for capturing a substantial portion of a spherical image. As used herein, a "camera assembly" refers to a structure comprising more than one electronic camera module, so that the separate camera modules are housed in single structure. As described throughout, the camera assemblies are designed to capture (i.e., image) a substantial portion of a spherical image. In terms of solid angle designations, a substantial portion refers to at least a solid angle of 2 $\pi$sr a spherical image.

Figure 4B:
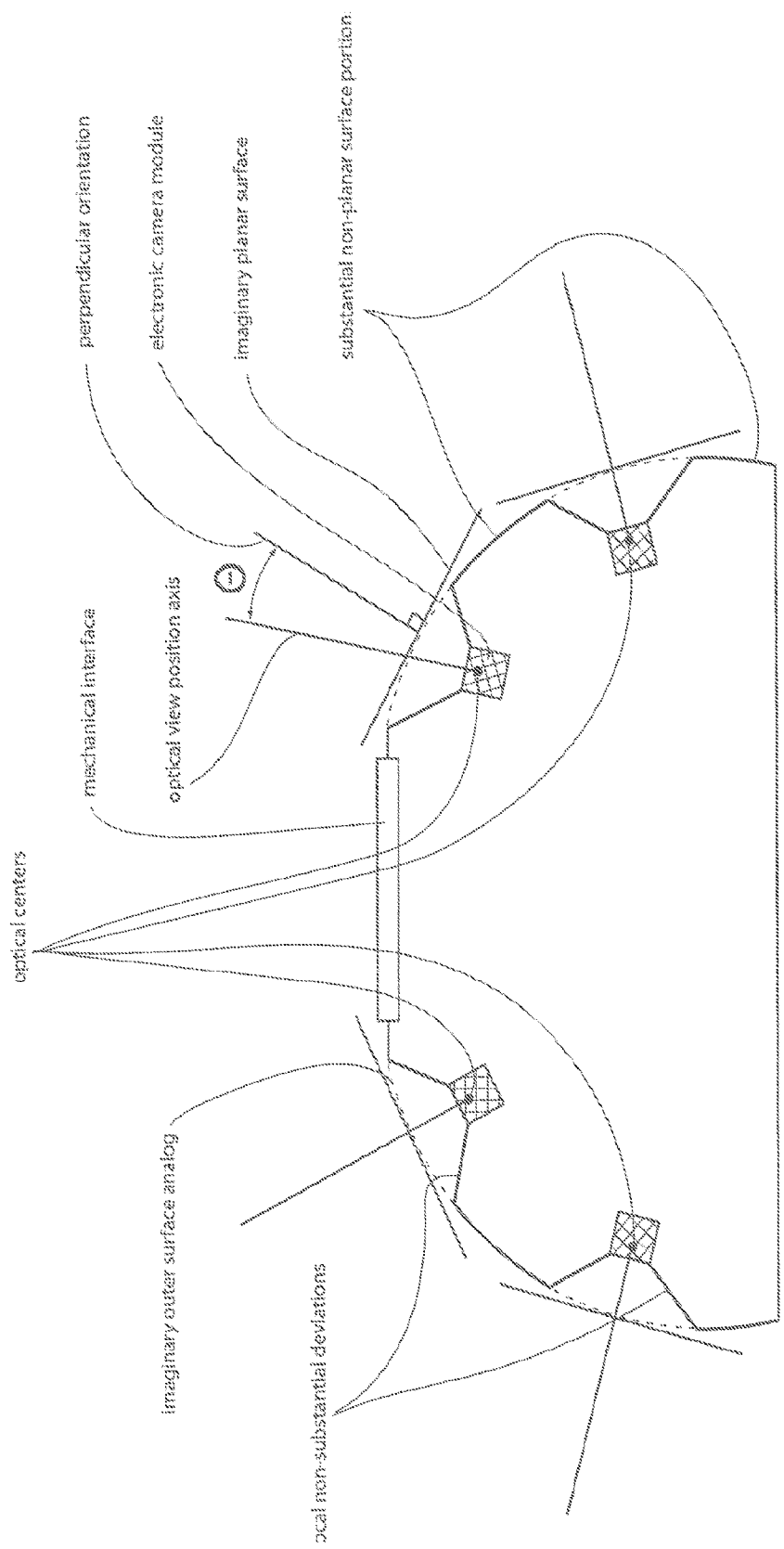

In suitable embodiments, the camera assembly comprises an encasement to provide an integral mechanical enclosure for the camera assembly. While FIGS. 4A-4B show an exemplary embodiment as described herein, it is to be understood that additional shapes beyond spherical assemblies are provided.

Suitably, the encasement comprises a three-dimensional outer surface having substantial non-planar surface portions. (i.e., the three-dimensional outer surface suitably does not comprise planar, flat sides.) That is that suitably the three-dimensional surface is spherical in shape, or otherwise oblong or football/rugby ball shaped. While other shapes such as cubes, pyramids, etc., can be utilized, in general a substantially spherical shape, or other rounded, oblong, oval or other elongated three-dimensional shape is readily utilized.

The encasement further comprises an imaginary outer surface analog representing an overall structural shape envelope of the three-dimensional outer surface. That is, the three-dimensional outer surface of the encasement is enveloped (i.e., covered) by an imaginary three-dimensional outer surface that is aligned with the shape of the encasement. For example, in the case of a sphere, the imaginary outer surface is aligned with the center of the sphere so as to completely encompass the sphere. This is illustrated in FIGS. 4A and 4B, and should be noted to sit directly on the surface of the encasement rather than be separate from it.

Suitably, one or more local non-substantial deviations of the three-dimensional outer surface from the overall structural shape envelope are not included in the imaginary outer surface analog. As shown in FIGS. 4A and 4B, such deviations can take the form of craters, crevices, indentations, cut-outs, or other structures in the surface of the encasement.

The encasement also suitably comprises three or more electronic camera modules positioned in the encasement, as shown in an exemplary embodiment in FIG. 4B. In embodiments, the encasement suitably comprises four or more, five or more, six or more, seven or more, eight or more, nine or more, 10 or more, 11 or more, 12 or more, 13 or more, 14 or more, 15 or more, 16 or more, 17 or more, 18 or more, 19 or more, 20 or more, 21 or more, 22 or more, 23 or more, 24 or more, 25 or more, 26 or more, 27 or more, 28 or more, 29 or more, 30 or more, 31 or more, 32 or more, 33 or more, 34 or more, 35 or more, 36 or more, 37 or more, 38 or more, 39 or more, 40 or more, 41 or more, 42 or more, 43 or more, 44 or more, 45 or more, 46 or more, 47 or more, 48 or more, 49 or more, 50 or more, 75 or more, 100 or more, 150 or more, 200 or more, and most suitably 36, electronic camera modules.

Each electronic camera module suitably has an optical view position axis, as shown in FIGS. 4A, 4B and 5A and 5B. As used herein, the "optical view position axis" of an electronic camera module is the ray starting at the optical center of the camera module and going along the optical main axis of the camera module into the viewing direction of the camera module, as shown in FIGS. 4A, 4B, 5A and 5B.

Suitably, the orientation of the optical view position axis of each electronic camera module of the encasement is different from the orientation of the optical view position axis of all but at least one other electronic camera module (or in other embodiments, the optical view position axis of each electronic camera module of the encasement is different from the orientation of the optical view position axis of all other electronic camera modules). That is, in embodiments, no two cameras point in the same exact direction and thus no two have the same exact optical view position axis, though in other embodiments, two (or more) electronic camera modules can have the same optical view position axis). In other embodiments, an orientation of the optical view position axis of two or more electronic camera modules are substantially similar. That is, the same view direction is imaged by more than 50% of the pixels of each of the two or more cameras respectively, resulting in a stereo image, thereby allowing gathering of 3-dimensional information about an image.

In suitable embodiments, the orientation of the optical view position axis of at least one electronic camera module of the three or more electronic camera modules is substantially non-perpendicular to an imaginary planar surface area located adjacent an optical center of the at least one electronic camera module and oriented tangential to the imaginary outer surface analog. See FIGS. 4A, 4B, 5A and 5B.

Suitably, the at least one local non-substantial deviation is an indentation in the three-dimensional outer surface that positions and protects one of the electronic camera modules, as illustrated in FIGS. 4A and 4B.

Figure 6:
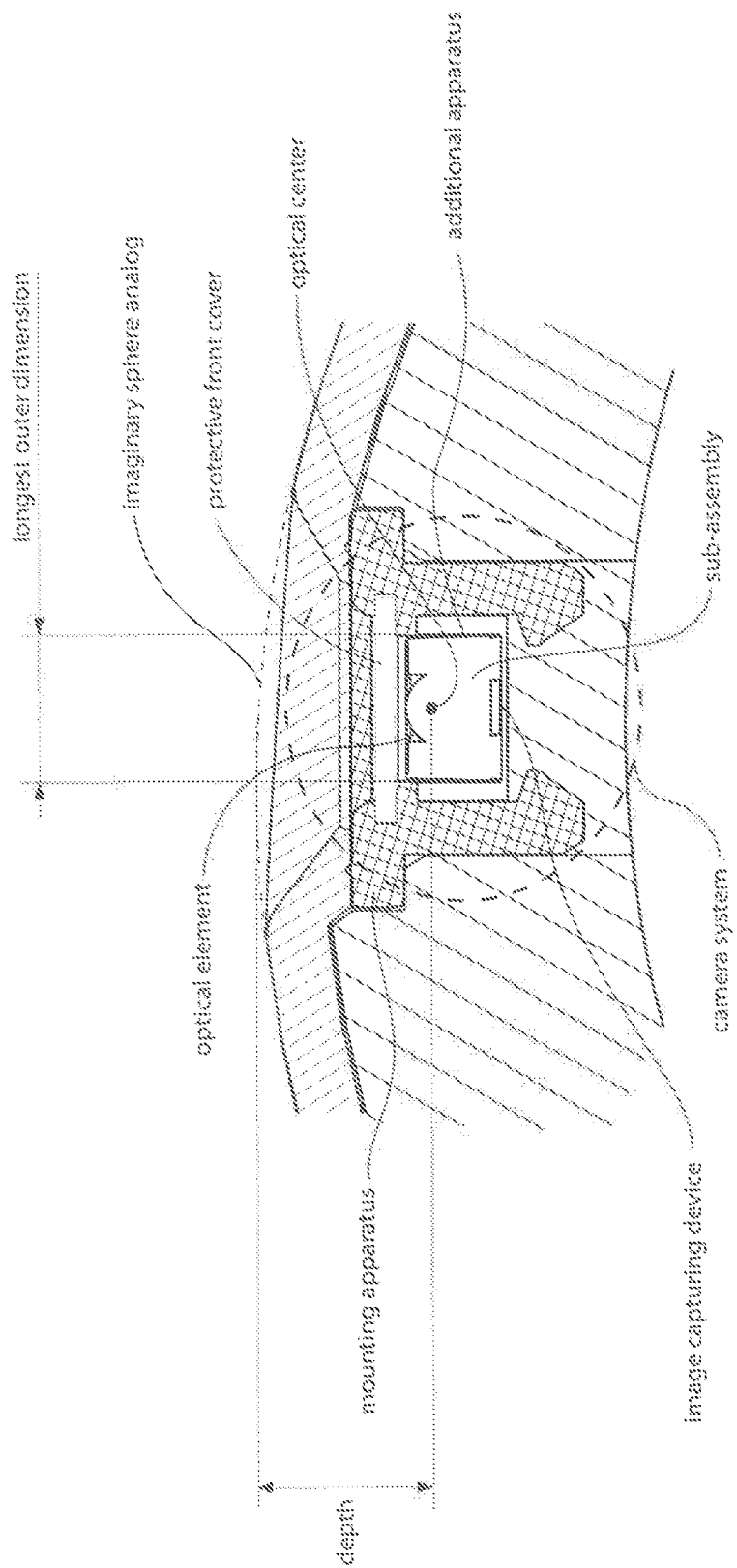
FIG. 6A is a schematic of an electronic camera module as described herein.
Figures 7A, 7B, 7C, 7D:
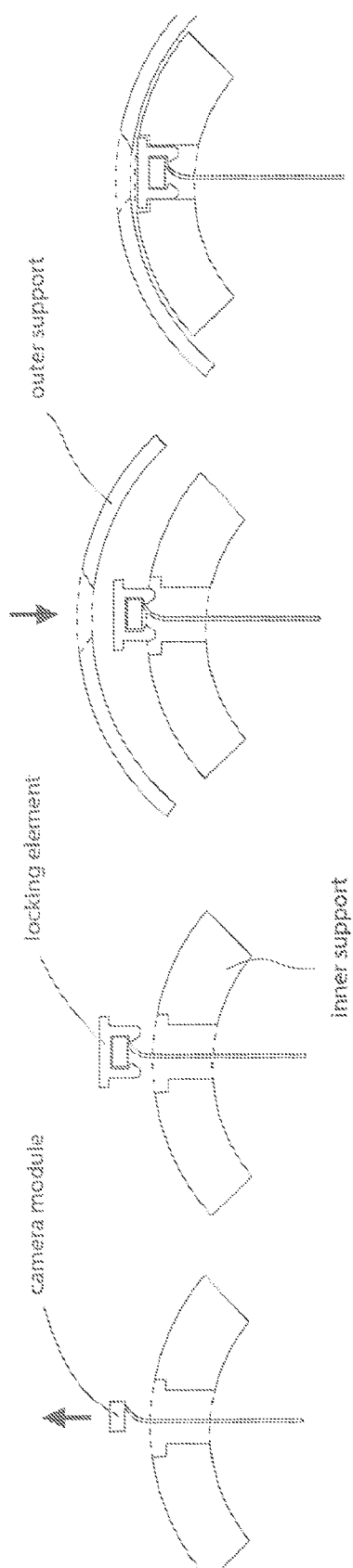
FIGS. 7A-7D show an electronic camera module in embodiments described herein.

In embodiments, the at least one of the electronic camera modules is a camera system (e.g., as shown in FIG. 6) comprising an image capturing device (e.g., a camera or CMOS device), one or more optical elements (e.g., a lens), with one of the one or more optical elements acting as a protective front cover (i.e., an additional lens) being substantially scratch resistant, and a mounting apparatus holding the image capturing device and the one or more optical elements.

In suitable embodiments, the image capturing device and at least one of the one or more optical elements form a sub-assembly held together by an additional apparatus, wherein the optical element acting as a protective front cover is not included in the sub-assembly. See FIG. 6. See also FIG. 7A-7D, illustrating the camera module (also called sub-assembly herein; and including the image capturing device and at least one optical element) in the mounting apparatus (also called locking element herein). Suitably, the mounting apparatus as shown in FIG. 6 has shock reducing properties.

In embodiments, a longest outer dimension of the at least one electronic camera module has a length between about 4 mm and about 28 mm, preferably between about 10 mm and about 24 mm, or more preferably between about 16 mm and about 20 mm.

In additional embodiments, the encasement comprises two or more parts (e.g., shell elements) interconnected at a set of mechanical interfaces to form the integral mechanical enclosure. As shown in the exemplary embodiment in FIG.

8, the set of mechanical interfaces divides up the three-dimensional outer surface and allows for a mechanical connection between at least two of the component parts of the encasement—i.e., the shell elements.

In suitable embodiments, at least one electronic camera module having the orientation substantially non-perpendicular to the imaginary planar surface area is located adjacent a mechanical interface of the set of mechanical interfaces. For example, FIG. 4B. Suitably, such a camera module is inclined in a direction toward the mechanical interface (i.e., the top of the encasement) in order to rotate the optical view position axis toward the mechanical interface so that a dead view zone adjacent the mechanical interface in minimized (FIGS. 4B and 5B). That is, the dead zone at the top "pole" of the spherical encasement is minimized, i.e., reduced to such a level that is not distinguishable. As described throughout, suitably the camera assembly described herein has a three-dimensional outer surface of the encasement that is substantially spherical (i.e., within a small variation of a spherical shape and suitable a sphere).

In exemplary embodiments, an angle between the optical view position axis of the at least one electronic camera module having the orientation substantially non-perpendicular to the imaginary planar surface area and a perpendicular orientation with respect to the imaginary planar surface area (labeled as angle "Θ" in FIGS. 4A and 4B) is between about 1° and about 30°, or preferably between about 2° and about 20°, or between about 3° and about 12° and most preferably between about 4° and about 11° or between about 4° and about 10°.

In additional embodiments, a camera assembly for capturing a substantial portion of a spherical image is provided. Suitably, the camera assembly comprises an encasement to provide an integral mechanical enclosure for the camera assembly. The encasement comprises a three-dimensional outer surface having a substantially spherical shape, an imaginary sphere analog substantially aligned in position and radius with the three-dimensional outer surface (see FIG. 4A-4B), and three or more electronic camera modules positioned in the encasement. Suitably, each electronic camera module has an optical view position axis, wherein the orientation of the optical view position axis of each electronic camera module is different from the orientation of the optical view position axis of all but at least one other electronic camera module (or in other embodiments, the optical view position axis of each electronic camera module of the encasement is different from the orientation of the optical view position axis of all other electronic camera modules), and wherein the orientation of the optical view position axis of at least one electronic camera module of the set of the three or more electronic camera modules is substantially non-parallel to an imaginary line passing through the center of the imaginary sphere analog to an optical center of the at least one electronic camera module (see FIG. 5B). In exemplary embodiments, an angle between the optical view position axis of the at least one electronic camera module having the orientation substantially non-parallel to the imaginary line passing through the center of the imaginary sphere analog to an optical center of the at least one electronic camera module (labeled as angle "Ω" in FIG. 5B) is between about 1° and about 30°, or preferably between about 2° and about 20°, or between about 3° and about 12° and most preferably between about 4° and about 11° or between about 4° and about 10°.

In exemplary embodiments, an encasement is an assembly of two or more parts (shell elements in FIG. 8) interconnected by a set of mechanical interfaces to form the integral mechanical enclosure, the set of mechanical interfaces dividing up the three-dimensional outer surface. Suitably, as shown in FIGS. 5A and 5B, the at least one electronic camera module having the orientation substantially non-parallel to the imaginary line is located adjacent a mechanical interface of the set of mechanical interfaces and is inclined in a direction toward the mechanical interface (or a portion of the mechanical interface) in order to rotate the optical view position axis toward the mechanical interface so that a dead view zone (or dead zone view) adjacent the mechanical interface in minimized. That is, for example, a dead zone at the top "pole" of the spherical encasement is minimized, i.e., reduced to such a level that is not noticeable on a final image taken with the camera assembly.

In exemplary embodiments, a distance between an optical center of each of the three or more electronic camera modules and the surface of the imaginary sphere (the depth of the camera module as shown in FIG. 6) is between about 2 mm and about 15 mm, or preferably between about 4 mm and about 12 mm, or more preferably between about 6 mm and about 10 mm.

In additional embodiments, provided herein are camera assemblies for capturing a substantial portion of a spherical image, comprising an encasement to provide an integral mechanical enclosure for the camera assembly, the encasement comprising a three-dimensional outer surface having substantial non-planar surface portions, three or more electronic camera modules positioned in the encasement, one or more electronic circuit boards, one or more energy source components (e.g., one or more batteries) and one or more electronic cable structures interconnecting the electronic circuit boards, the camera modules and the energy source components. Suitably, the camera assembly has a central weight distribution, i.e., all of the components of the assembly are optimized and arranged to create an assembly that has its weight equally distributed about the center of the assembly.

Figure 9:
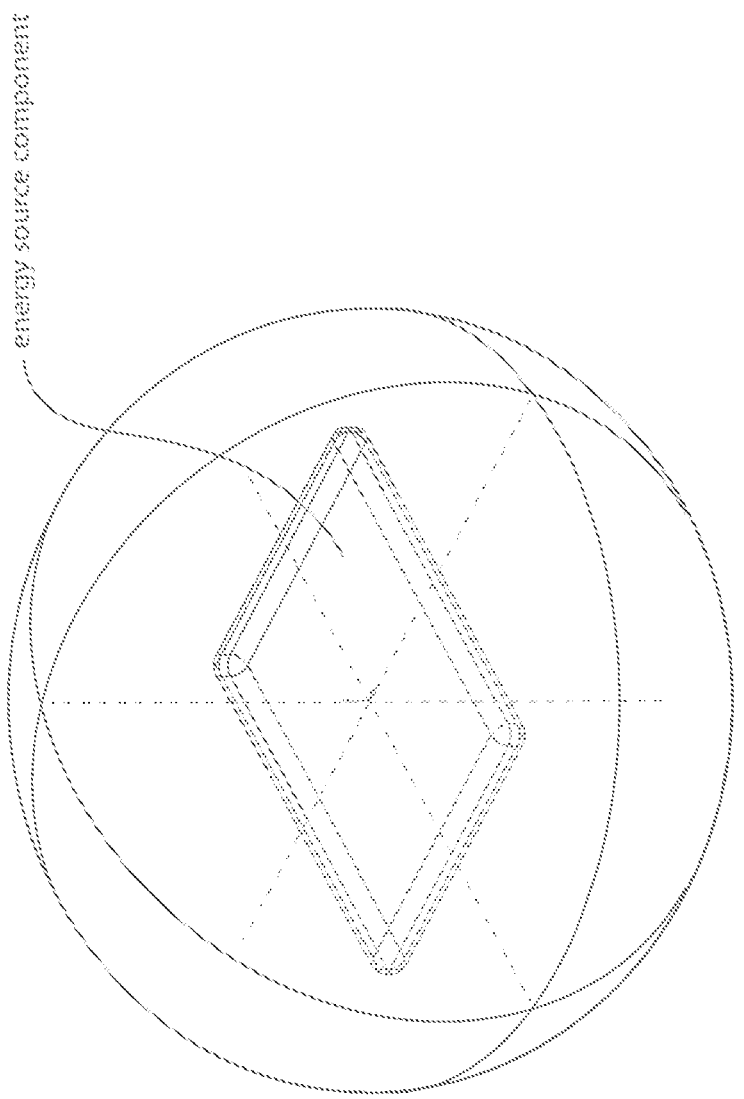
FIG. 9 shows an encasement with a centrally positioned and fixed energy source component.
Figures 10A, 10B, 10C:
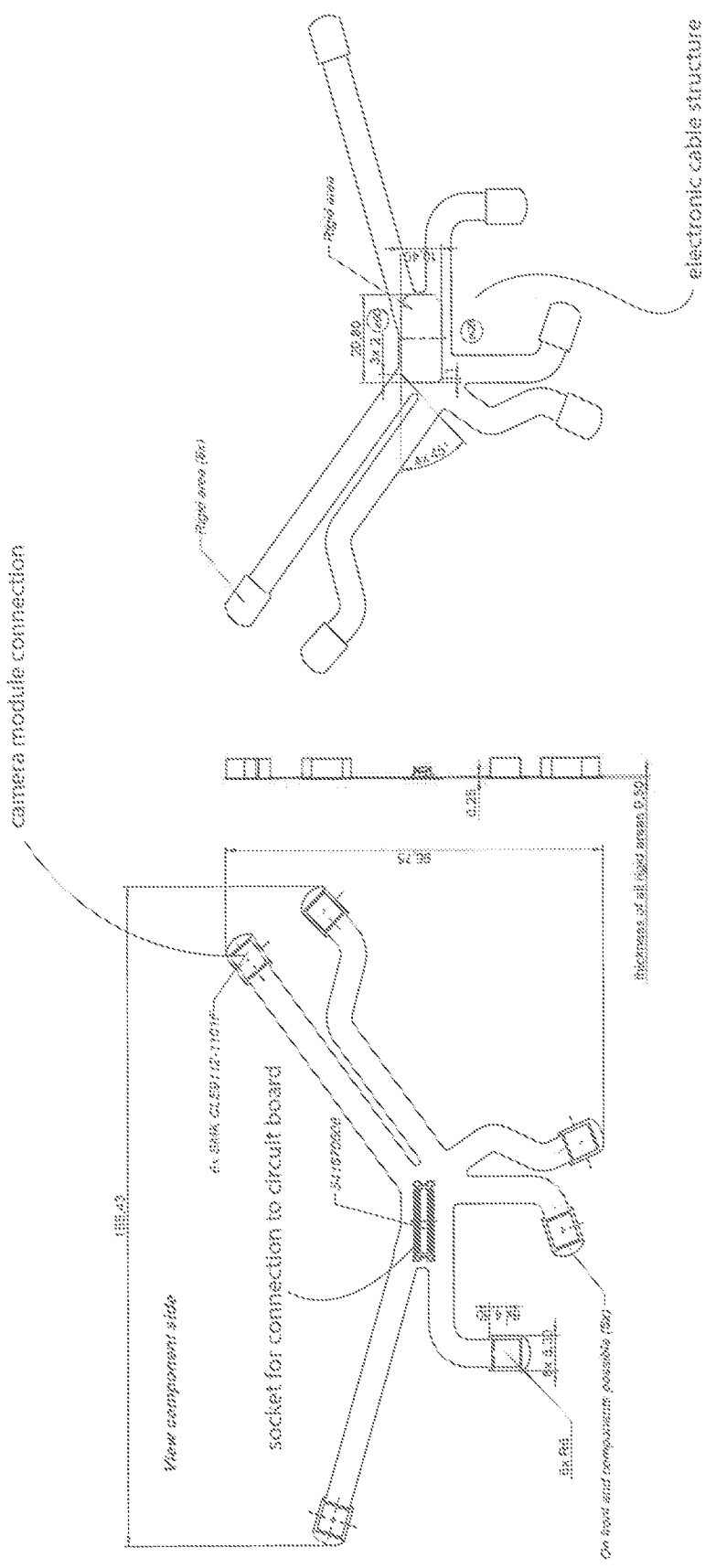
FIGS. 10A-10F show an electronic cable structure for use in the embodiments described herein.
Figures 10D, 10E, 10F:
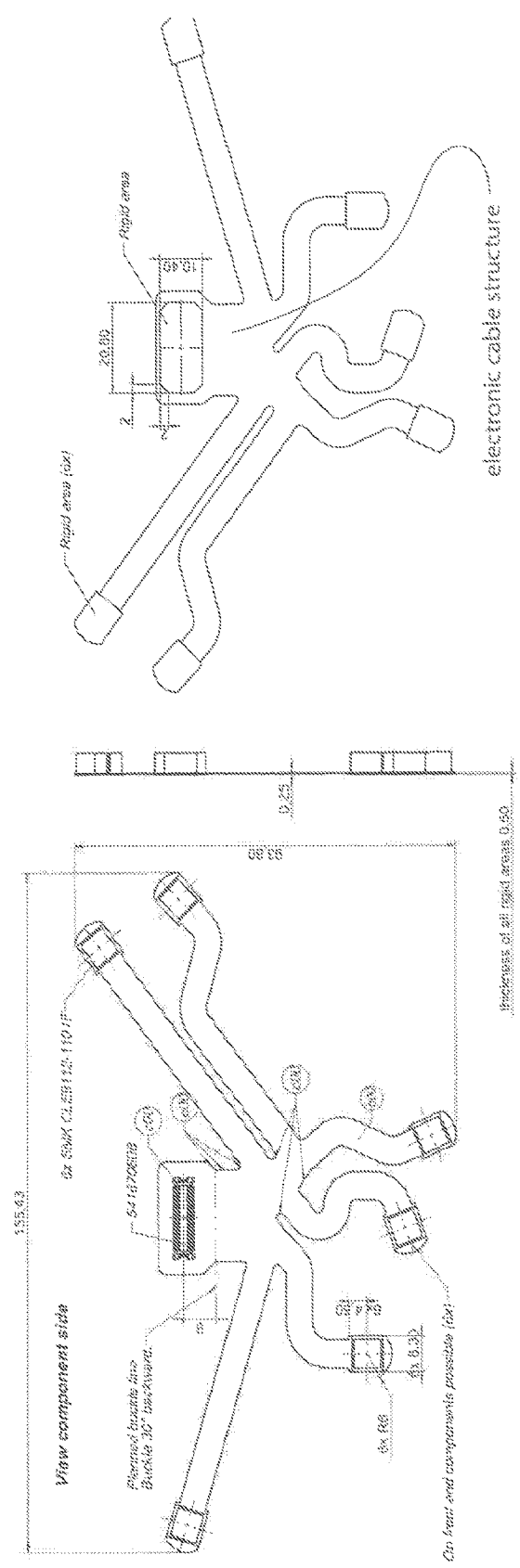

As described herein, suitably the encasement has a substantially spherical shape, and an imaginary outer spherical surface analog representing an overall structural shape envelope of spherical shape, and the at least one energy source component is positioned and fixed within the encasement at the center of the imaginary outer spherical surface analog. As shown in FIG. 9, suitably the energy source component, e.g., battery, is fixed at the center.

In additional embodiments, a camera assembly for capturing a substantial portion of a spherical image is provided. The camera assembly suitably comprises an encasement to provide an integral mechanical enclosure for the camera assembly, the encasement having a three-dimensional outer surface, the three-dimensional outer surface having substantial non-planar surface portions, three or more electronic camera modules positioned in the encasement, each electronic camera module having an optical view position axis. Suitably an orientation of the optical view position axis of each electronic camera module is different from the orientation of the optical view position axis of all but at least one other electronic camera module (or in other embodiments, the optical view position axis of each electronic camera module of the encasement is different from the orientation of the optical view position axis of all other electronic camera modules). Suitably the encasement further comprises one or more active electronic circuit boards, one or more energy source components and one or more electronic cable structures interconnecting the active electronic circuit boards, the camera modules and the energy source components.

Figure 11:
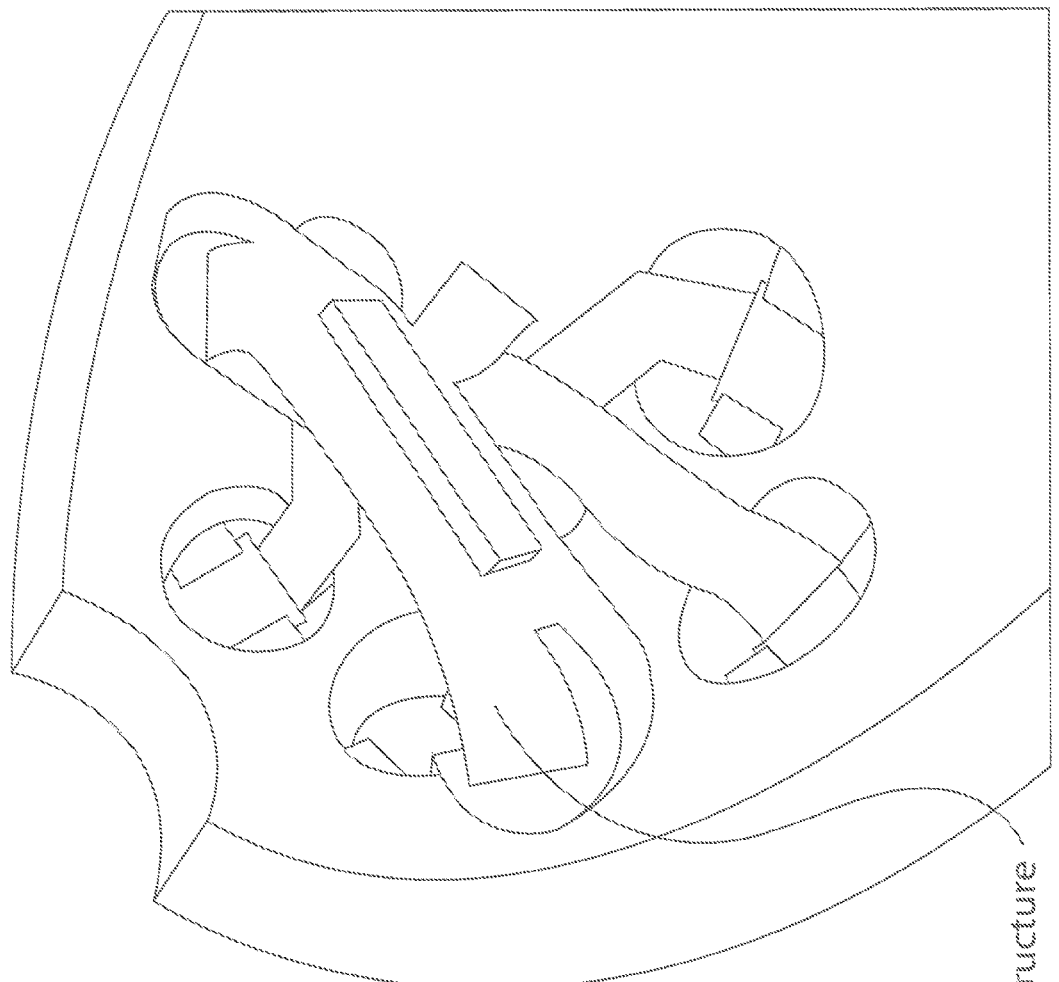
FIG. 11 shows an electronic cable structure inside of an encasement.

In suitable embodiments, and as shown in FIGS. 10A-10F, at least one electronic cable structure interconnects at least one electronic circuit board and at least two camera modules (at the camera module connection) and has a main flat extension. The at least one electronic cable structure includes a set of conductors arranged adjacent each other in the main flat extension, the at least one electronic cable structure has at least two extension portions connecting to the at least two camera modules, each extension portion and a corresponding routing of the corresponding conductors of the set of conductors are positioned in its extension. Suitably the at least one electronic cable structure is a passive printed circuit board (PCB) having substantially flexible portions. In embodiments, six of the electronic cable structures are used to connect the various electronic cameras and circuit boards to provide control over the cameras. As shown in FIG. 11, the electronic cable structures are readily flattened, folded, bent and shaped to fit into the inside of a spherical enclosure.

Figure 8:
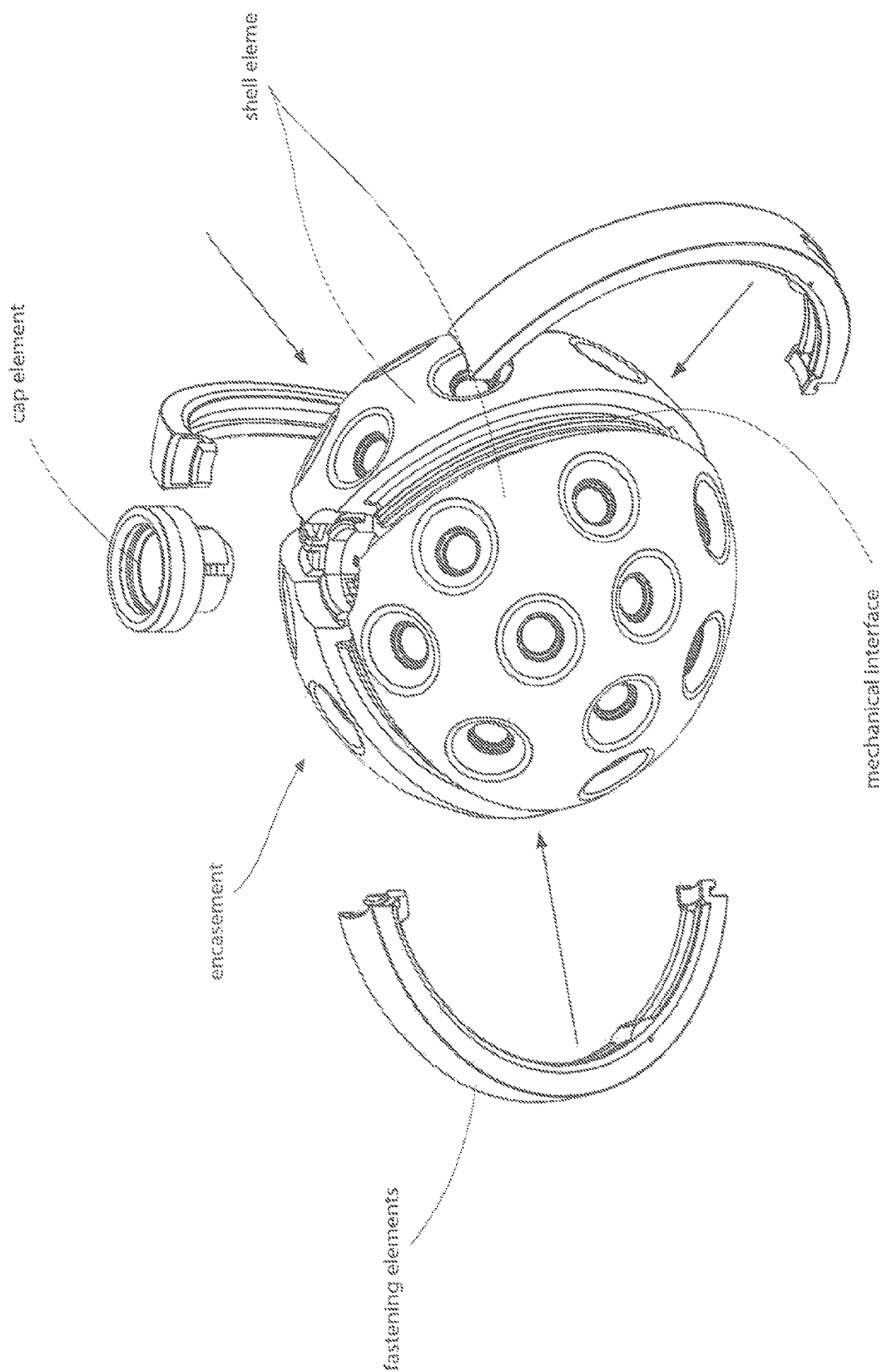
FIG. 8 shows an embodiment of a camera assembly as described herein.

In still further embodiments, a camera assembly for capturing a substantial portion of a spherical image is provided, the assembly comprising an encasement to provide an integral mechanical enclosure for the camera assembly, the encasement having a three-dimensional outer surface and a substantially spherical shape, the encasement comprising an assembly of two or more shell elements, the two or more shell elements interconnected with a one or more mechanical interfaces to form the integral mechanical enclosure (see FIG. 8). As shown in FIG. 8, suitably the mechanical interfaces divide up the three-dimensional outer surface, each mechanical interface providing a form-locking fit to spatially position two adjacent shells; and three or more electronic camera modules positioned in the encasement.

Figure 12:
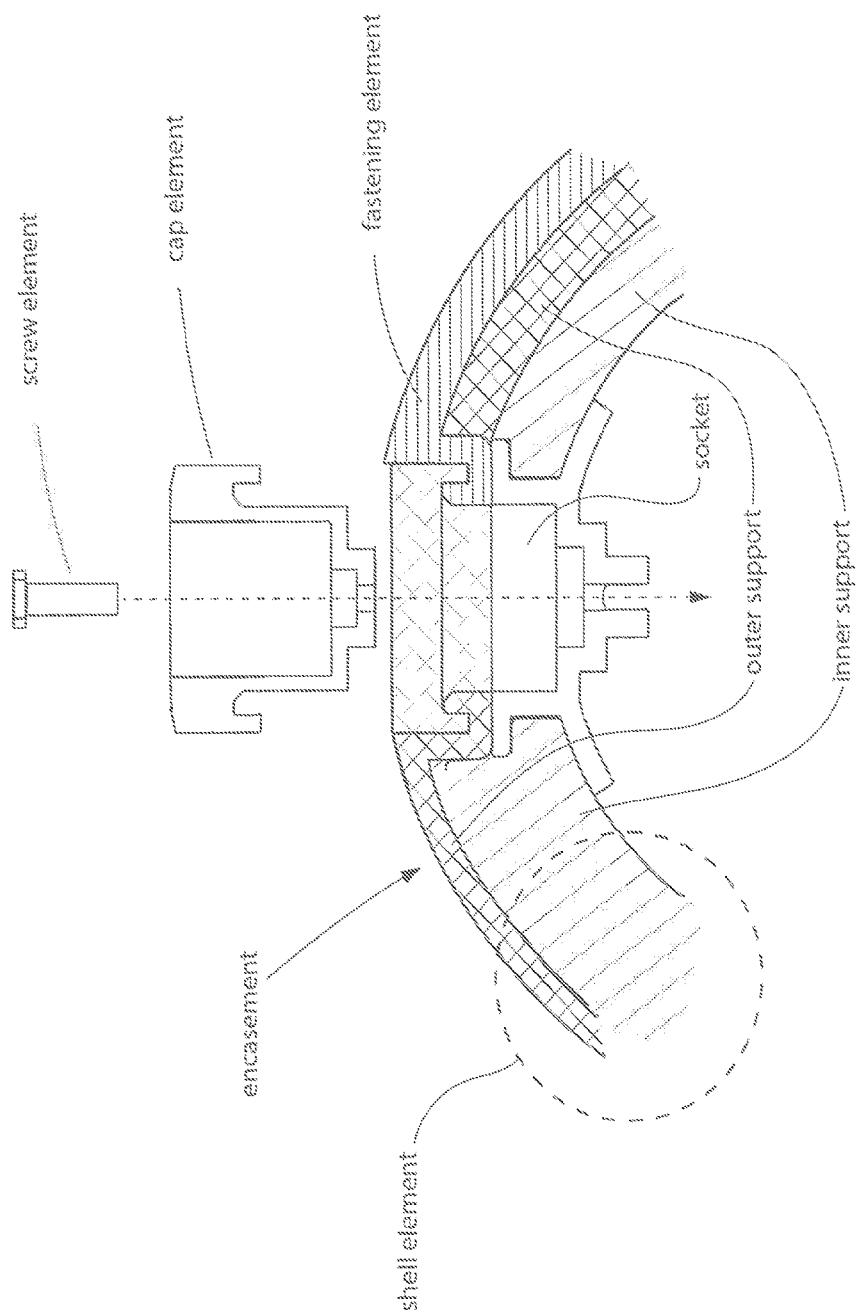
FIG. 12 shows the assembly of an encasement.
Figures 13A, 13B:
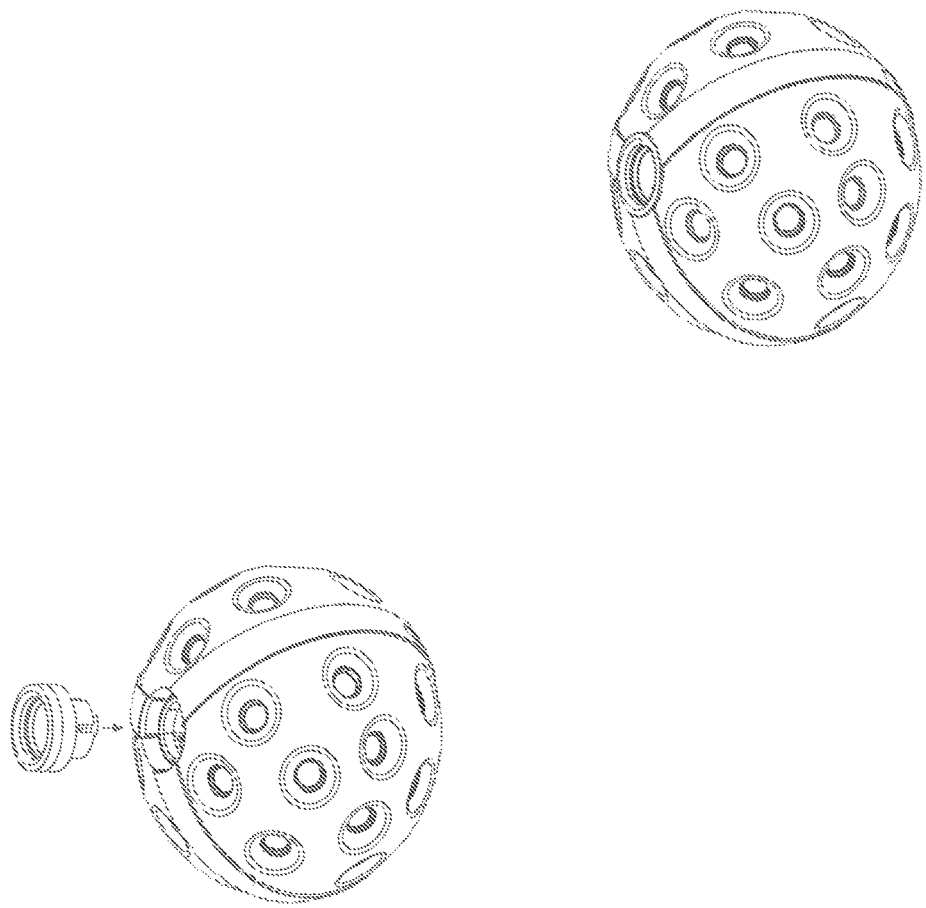
FIGS. 13A and 13B show a further stage of the assembly of an encasement.

As shown in FIG. 8 and FIG. 12, suitably the camera assembly further comprises a cap element that fits into a socket and locks the two or more shell elements, as well as the fastening element(s) in place. This is further illustrated in FIG. 12, where cap element is suitably attached to the encasement via a screw. The cap element locks an outer support and an inner support, as well as fastening elements (see FIG. 12 and FIG. 8) to form a final camera assembly that is robust and ready to be utilized as described herein (i.e. as a throw-able camera). Other elements which can be used to attach cap element include various nuts, bolts, rivets, various plastic connectors, etc. FIGS. 13A and 13B show additional stages of the assembly of the encasement where the shell elements are connected, the fastening elements are added, and finally the cap element (or two cap elements, one at each "pole") are added and secured. While three separate fastening elements are shown, in embodiments, a single "ring-shaped" fastening element can be used, as well as two arc-shaped elements, or more fastening elements if desired can also be used.

In embodiments, the assembly comprises three shell elements, each shell element having substantially the same shape and size so as to form the spherical shape, each shell element having 3 or up to 12 electronic camera modules. In embodiments, each shell element has 12 electronic camera modules, providing a total of 36 camera modules in the final assembly.

Suitably the outer shell is slightly elastic so as to not injure people and to reduce shock on impact for the electronics and mechanical parts, while being hard enough to keep the general form of the camera assembly so that inner parts like cables and PCBs are not crushed by a folding camera but instead stopped in a defined way by the inner shell. A substantially elastic inner shell element, i.e. those holding the camera modules, are meant to protect the electronics on impact.

As described herein, the fastening elements that attach at the positions of the mechanical interfaces. In embodiments, the fastening elements comprise a material (including polymeric or plastic material), including those below, that allows for shock absorbance.

Exemplary materials that make up the various components of the camera assemblies provided herein include, but are not limited to:

Outer Support suitably comprises:
TPU (Thermoplastic Urethane)
SI (Silicone Rubber)
SAN (Styrene-Acrylonitrile-Copolymer)
PSU (Polysulfone)
PET (Polyethylene Terephtalate)
PS-HI (Polystyrene High Impact)
Inner Support suitably comprises:
PU Foam (Polyurethane)
EPP (Expanded Polypropylene)
SI (Silicone Rubber)
Fastening Element (hard component) suitably comprises:
PC+PBT (Polycarbonate+Polybutylene Terephtalate)
PA (Polyamide), PA6, PA66
PC (Polycarbonate)
TPU (Thermoplastic Polyurethane)
PS-HI (Polystyrene High Impact)
TPC (Thermoplastic Polyester-Elastomer)
Fastening Element (soft/outer component) suitably comprises
TPU (Thermoplastic Polyurethane)
TPC (Thermoplastic Copolyester)
TPS (Styrol Block Copolymer)
TPV (Thermoplastic Vulcanizate)
TPO (Thermoplastic Olefin)
SI (Silicone Rubber)

It should also be understood that in addition to these materials, other materials, as well as various different combinations of the materials above, can also be used in the components of the embodiments described herein.

In suitable embodiments, as illustrated in FIGS. 7A-7D, the camera module is contained in a locking element that is oriented and locked in the inner support and covered by the outer support. The locking of the camera module into the inner support is achieved by using a locking element that has hooks, clips or lips, as shown in FIGS. 7A-7D. The camera module is first inserted through the inner support, and into a locking element (suitably a flexible, polymeric/rubber element or similar material). The locking element is placed into the socket in the inner support where the hooks or clips keep the camera module locked in place—i.e., it cannot pull outward from the enclosure (after addition of the shell), and also cannot be pulled inward toward the center of the enclosure. The outer shell is then added.

Figures 14A, 14B, 14C:
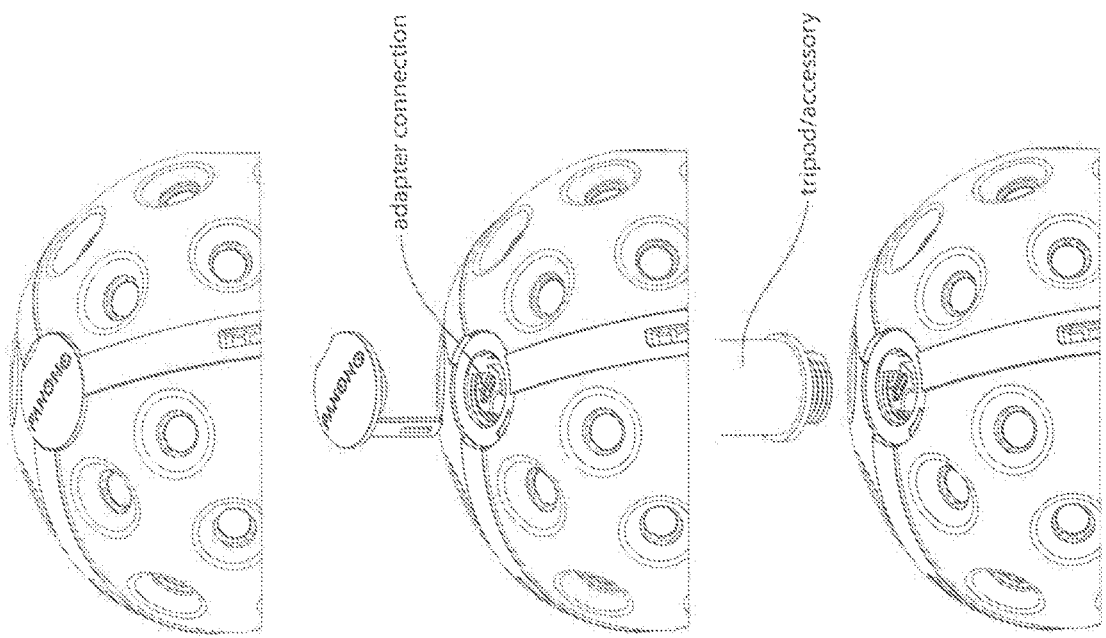
FIGS. 14A-14C show a camera assembly as described herein.

FIGS. 14A-14C illustrate an exemplary embodiment that further comprises an adapter connection that can allow for the addition of a tripod or other accessory. The accessories or adapter connector suitably comprises a mechanical mounting feature (e.g. a thread, or a magnet, or a guide with a magnet), an electrical socket or plug (e.g. a [micro] USB socket), and can optionally comprise alignment pins (and corresponding holes) that lead the plug or socket that goes into the electrical socket or plug and therefore aligns it for insertion, a cap to keep out dust and provide cushioning for the accessories or adapter connector on impact.

The adapter connection is suitably prepared so as to accept an accessory (e.g., adaptor, stick, tripod, etc.). That is an accessory can be inserted into adapter connection. In embodiments, as shown in FIG. 14D-14E (top view), the adapter connection includes a first positioning socket (1) and a second positioning socket (2), which are suitably of different sizes, so that an adapter can only be inserted in one position.

FIG. 14F-14G (top view) show an exemplary adapter (or a stick) comprising a plug having a first positioning block (1) and a second positioning block (2), which are complementary to first positioning socket (1) and second positioning socket (2) on the adapter connection. The use of the two blocks and two corresponding sockets allows for only a single orientation in the mounting, thereby increasing speed and ease of connection, as well as reducing damage to, for example, USB sockets, etc.

Figure 14H:
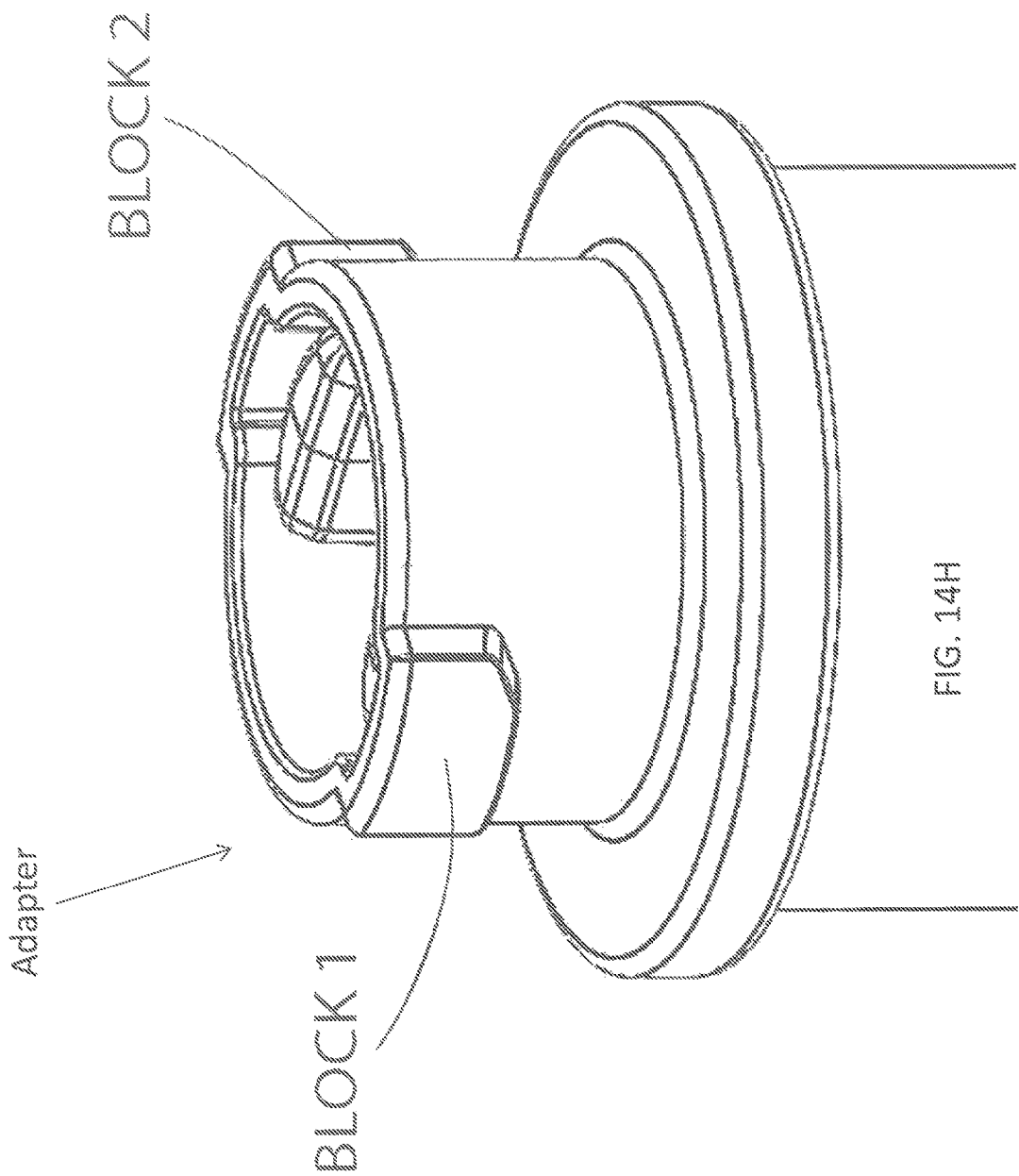

FIG. 14H shows a close-up view of the adapter with first and second positioning blocks (block 1 and block 2).

The accessory or adapter connector suitably comprises a USB socket location which doubles as the mounting point for e.g. a tripod adapter, a stick or other accessories. It combines a mechanical mount point with an electrical mounting point, while the mechanical mounting point securely connects, e.g. screws, some mechanical accessory, for example a mounting device to the camera assembly e.g. mounting on a helmet, a bicycle, a car, a plane, a drone, a quadcopter, an octocopter, a standard tripod (using a standard screw), called "tripod adapter," a handle of some sort, e.g. a stick with a handle, a parachute device, a flash light device, a (remote) flash control device.

Figure 14I:
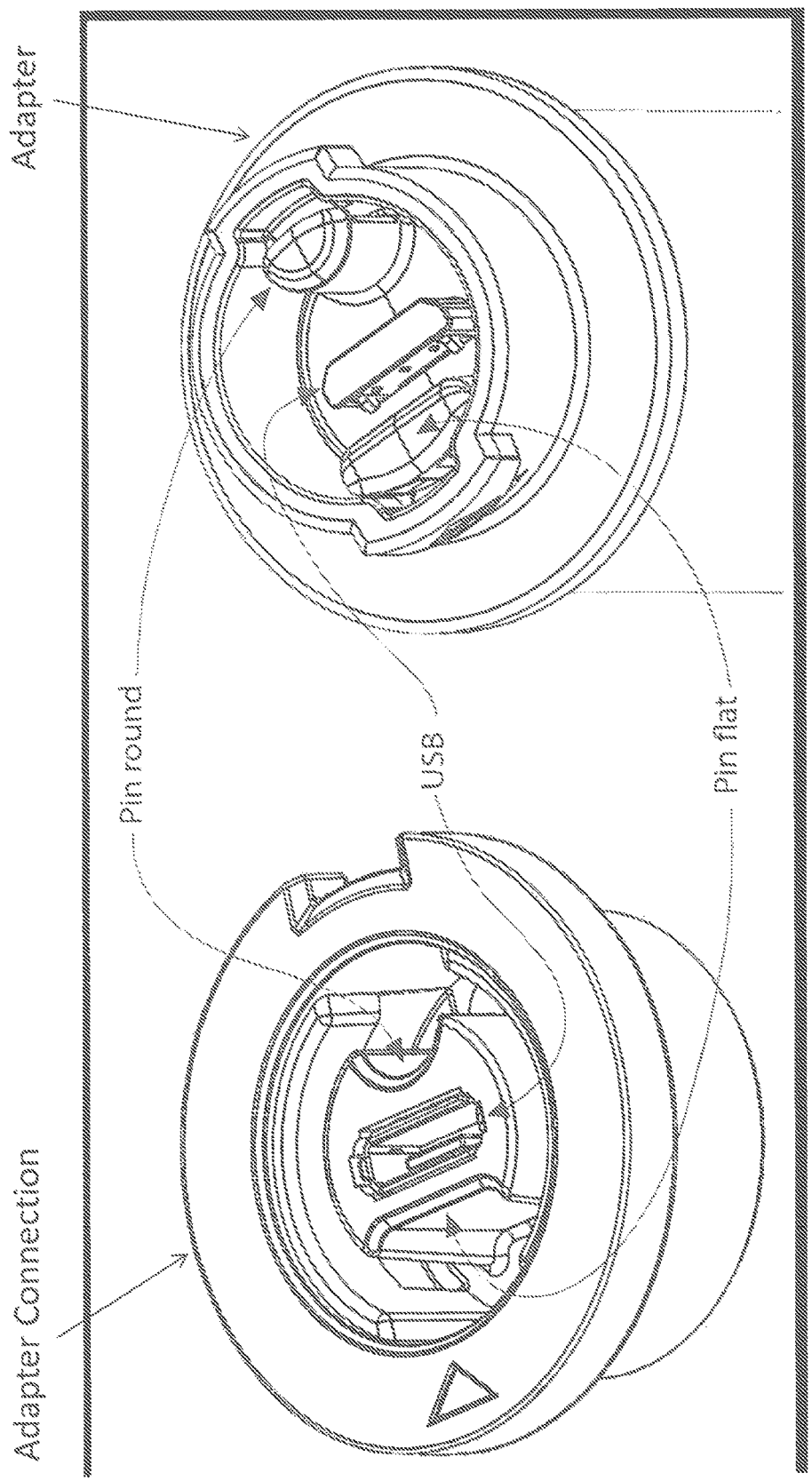

As shown in FIG. 14I, the adapter connection suitably comprises a USB socket or USB port. Additional connection devices, such as micro USB sockets or similar, can also be included in the adapter connection. The inner part of the adapter connection also suitable utilizes different shapes, e.g., a round or flat pin, to ensure proper orientation and reduce strain on the USB socket if the spring mechanism used for attachment doesn't function properly.

Figure 14J:
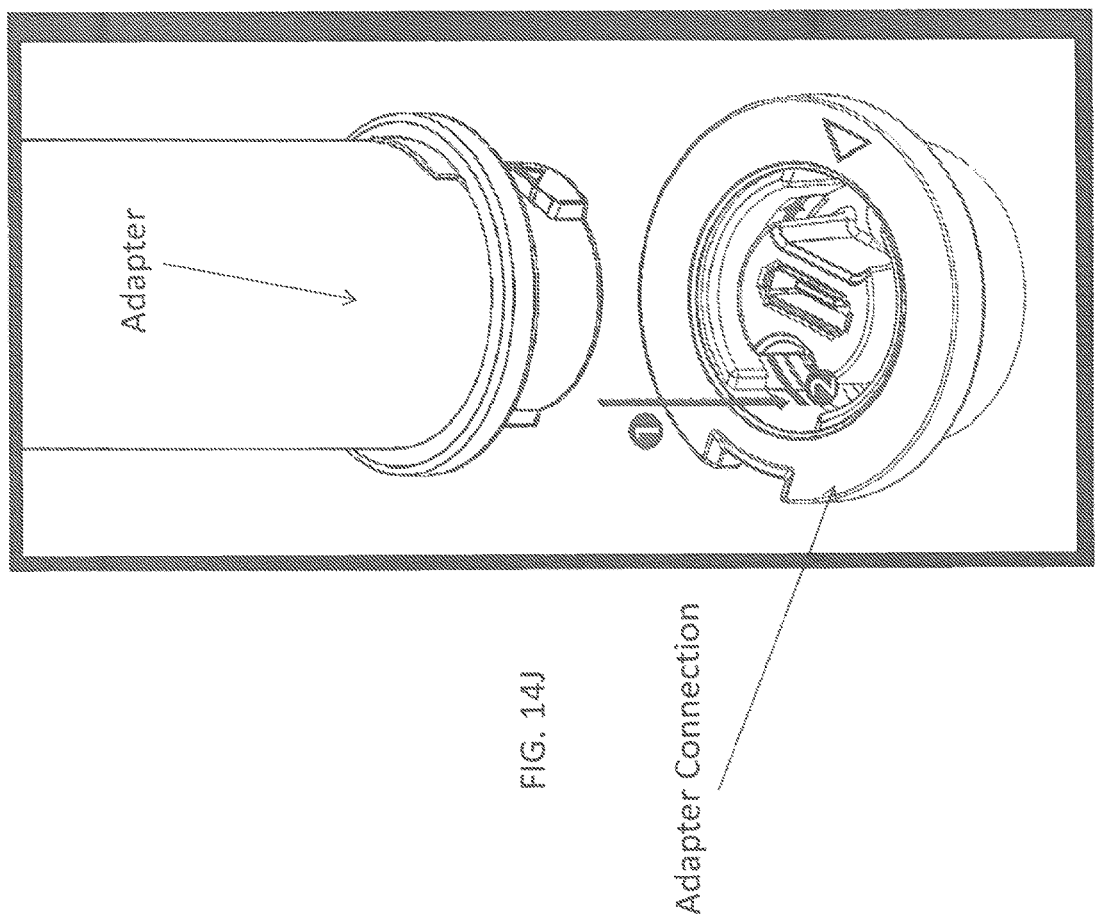

FIG. 14J illustrates the insertion of an adapter into the adapter connection, where the positioning blocks (1/2) and positioning sockets (1/2) are aligned, thereby only allowing only an assembly where corresponding parts fit with one another. This insertion can also be used for other accessories, such as a stick, as described herein, which utilize the positioning block/positioning socket system described herein.

Figure 14K:
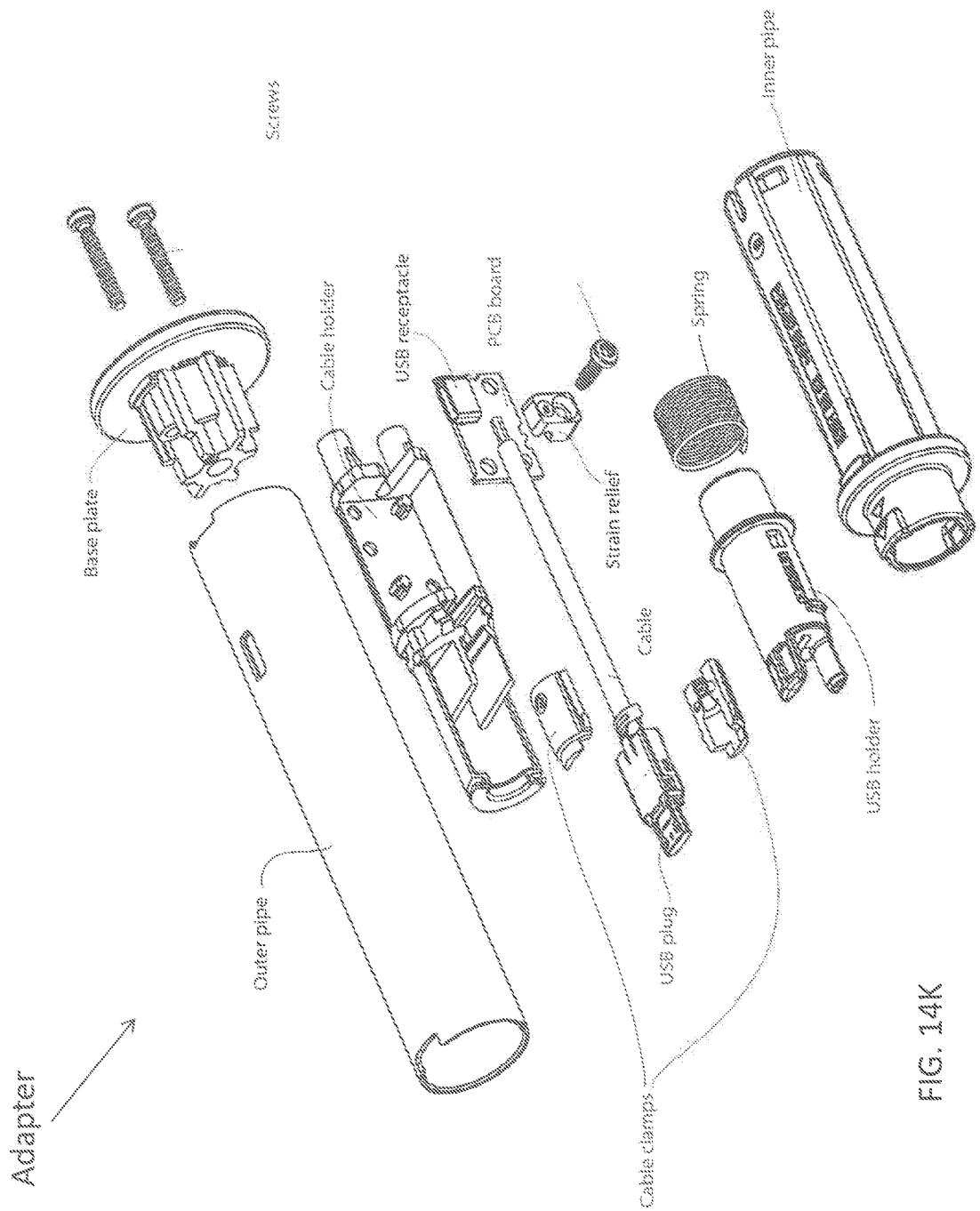

FIG. 14K shows an example of an adapter as described herein. Such adapters can be further mounted on tripod or other device. The adapter comprises a USB plug to connect to the USB socket of the adapter connection and a USB socket/receptacle on its side which allows for charging of the camera as well as connection to a computer. As the adapter has a certain length, a tripod is not as big in the picture which means better panoramas and easier stitching (joining the 36 images into a panorama by software) can be accomplished. The base plate is suitably designed so it does not wobble on different surfaces of tripods, i.e., it has a width which provides stability.

Electrical mounting point connecting electrical accessories which can be attached include, e.g., a trigger button, USB extension, a remote trigger device [cable and/or wireless], a flash light control unit, a wireless data transmission unit, parachute deploy unit, a connection to external devices/gadgets/vehicles.

Suitably a tripod adapter is provided which allows mounting on a tripod (standard photography tripod nut), while optionally also connecting to the USB socket and having an internal (USB) extension cord with a socket on the side of the tripod adapter so the USB connection to the camera assembly can still be used while the ball is mounted on a tripod (charging and/or data transmission).

A "stick" can be used for taking panoramas while holding the camera assembly with the stick gripping its handle. It may optionally connect to the USB socket on the ball and connect a button to it. That button may be mounted on the handle of the stick. In this way the use can trigger the camera from the stick handle.

Figure 14L:
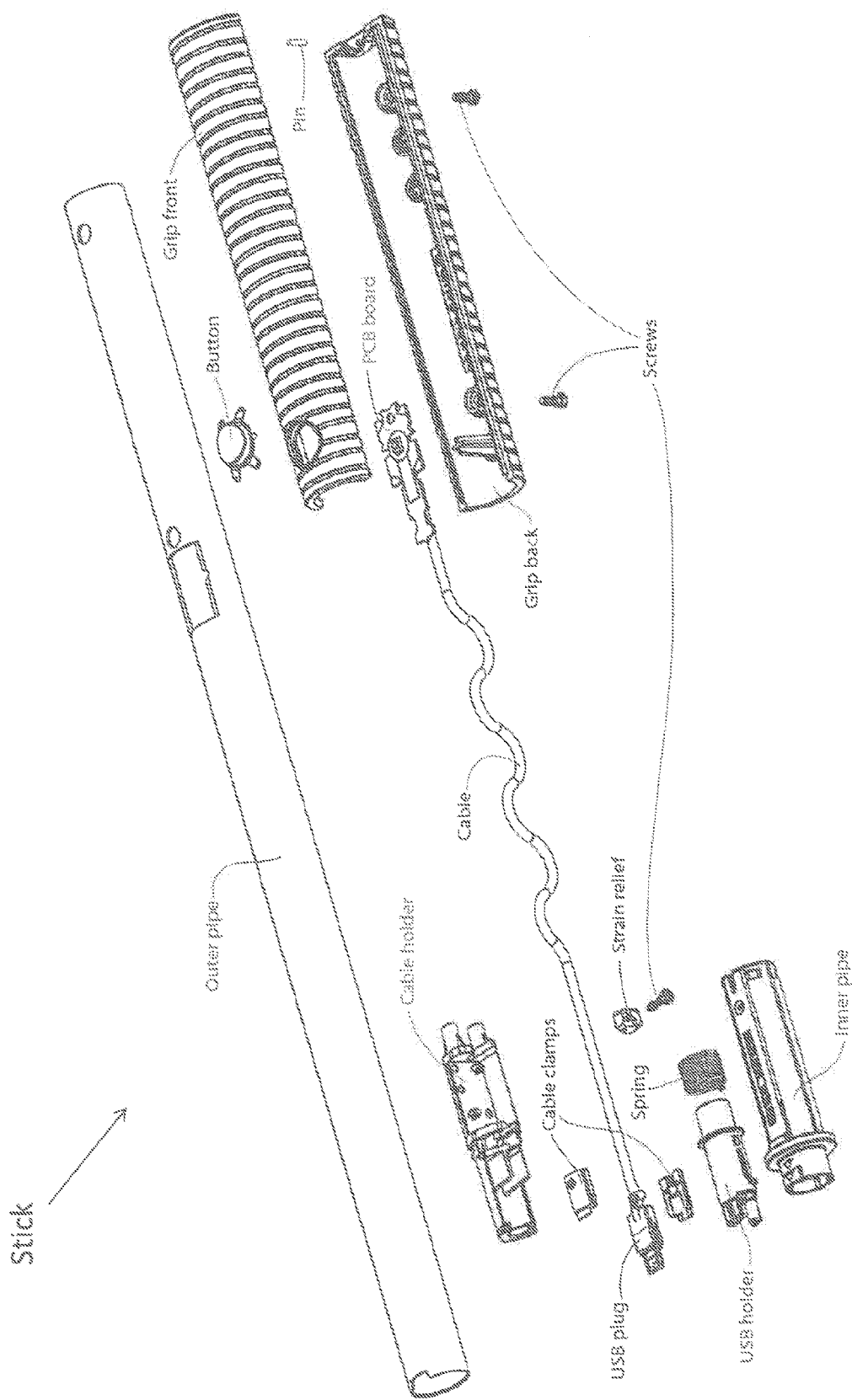

FIG. 14L shows an additional accessory, a stick, which can be connected to the camera via a plug on the stick connecting to the adapter connection. As shown in FIG. 14L, the stick suitably comprises a grip and a trigger button (also called a "selfie stick") that allows for the camera assembly to be held away from the body in a static (or moving if desired) position, prior to acquiring an image. The stick suitably comprises a USB plug for insertion into the USB socket of the adapter connection. The stick can also further comprise an attachment point for attaching a safety leash, etc.

Figure 14M:
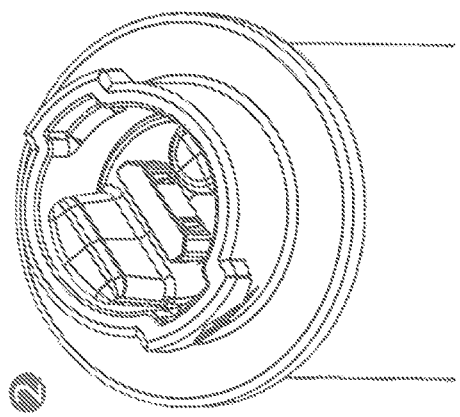
Figure 14N:
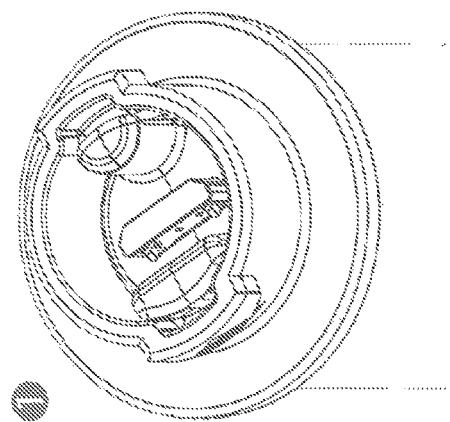
Figure 14O:
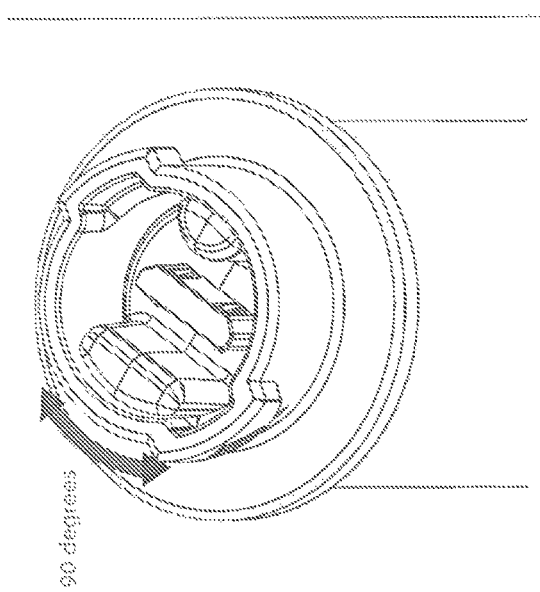

FIGS. 14M-O show the action of the adapter or stick as it is inserted into the adapter connection. A USB cable is fixed by the "Strain relief" element shown in FIGS. 14K and 14L. The cable is then twisted when the "USB holder" is rotated. Then it is held by the 'Cable clamps' in FIGS. 14K and 14L. A spring makes sure the "USB holder" part is always rotated back into position 1, even if vibration or a user turns it towards position 2. FIGS. 14M-O show the positions and rotation action.

In embodiments, the camera assembly can comprise a button and/or indicator (e.g., an LED or a buzzer) for user interaction. It suitably also comprises a data connection like WLAN or USB. If a USB connection or the like is used, it is suitably connected such that a socket or plug is mounted so that it does not get damaged when the camera hits the ground. Such a socket can be hidden by a rubber plug or similar that at the same time provides impact protection as well as protection against dust.

Figures 15A, 15B:
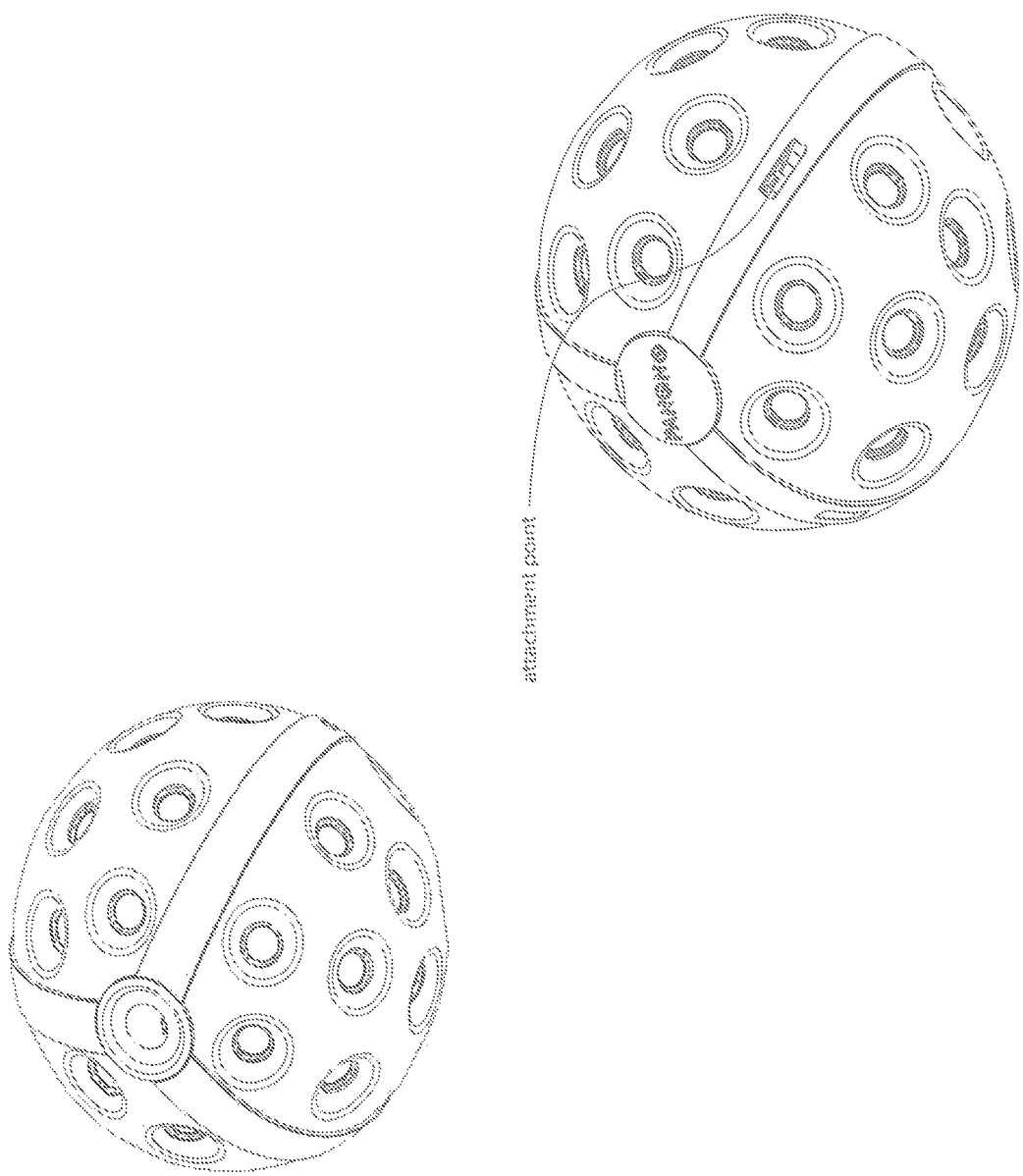
FIGS. 15A-15B show an additional camera assembly as described herein.

FIGS. 15A-15B illustrate embodiments which comprise attachment points or mounting points for the addition of ropes or other connections. Such attachment points should be sturdy and not interfere with the acquisition of images. When mounted with an adapter that is attached to the "Tripod-Adapter/Stick connector" under a drone/quadrocopter/etc., ropes can be attached and tightened between the rope attachment points and the drone to provide stability/stiffness to the drone camera assembly. When mounted on a (high) tripod/pole using the "Tripod-Adapter/Stick connector," ropes can be attached and tightened between the rope attachment points and the ground/surrounding objects to provide stability and for example prevent movement of the camera due to windy conditions. The attachment points or mounting points are preferably located on the enclosure in a location where a majority of the surface normals of the surrounding surface region of the enclosure has an angle between 40° and 80°, preferably between 50° and 70°, especially 60° angle in relation to the axis along the main insertion direction of the "Tripod-Adapter/Stick connector".

Note, it should be understood that one of ordinary skill in the art should understand that the various aspects of the present invention, as explained above, can readily be combined with each other.

The words used in this specification to describe the various exemplary embodiments of the present invention are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word, itself.

The various embodiments of the present invention and aspects of embodiments of the invention disclosed herein are to be understood not only in the order and context specifically described in this specification, but to include any order and any combination thereof. Whenever the context requires, all words used in the singular number shall be deemed to include the plural and vice versa. Words which import one gender shall be applied to any gender wherever appropriate. Whenever the context requires, all options that are listed with the word "and" shall be deemed to include the world "or" and vice versa, and any combination thereof. The titles of the sections of this specification and the sectioning of the text in separated paragraphs are for convenience of reference only and are not to be considered in construing this specification.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

In the drawings and specification, there have been disclosed embodiments of the present invention, and although specific terms are employed, the terms are used in a descriptive sense only and not for purposes of limitation, the scope of the invention being set forth in the following claims. The invention has been described in considerable detail with specific reference to the illustrated embodiments. It will be apparent, however, that various modifications and changes can be made within the spirit and scope of the invention as described in the foregoing specification.

NUMERAL LIST

1 Single cameras
2 Sensors
3 Control unit
4 Supporting structure
5 Padding
6 Recesses
7 Acceleration
8 Beginning of the launch phase
9 End of the launch phase
10 Integrated area
11 Actuatory components

We claim:

1. A camera assembly for capturing a substantial portion of a spherical image, the camera assembly comprising:
   i. an encasement to provide an integral mechanical enclosure for the camera assembly, the encasement comprising:
      a. a three-dimensional outer surface having substantial non-planar surface portions,
      b. an imaginary outer surface analog representing an overall structural shape envelope of the three-dimensional outer surface, so that one or more local non-substantial deviations of the three-dimensional outer surface from the overall structural shape envelope are not included in the imaginary outer surface analog; and
   ii. three or more electronic camera modules positioned in the encasement, each electronic camera module having an optical view position axis,
      wherein the orientation of the optical view position axis of each electronic camera module is different from the orientation of the optical view position axis of all but at least one other electronic camera module,
      wherein the orientation of the optical view position axis of at least one electronic camera module of the three or more electronic camera modules is substantially non-perpendicular to an imaginary planar surface area located adjacent an optical center of the at least one electronic camera module and oriented tangential to the imaginary outer surface analog,
      wherein at least one of the electronic camera modules is a camera system comprising:
         a. an image capturing device;
         b. one or more optical elements, with one of the one or more optical elements acting as a protective front cover being substantially scratch resistant; and
         c. a mounting apparatus holding the image capturing device and the one or more optical elements; and
      wherein the image capturing device and at least one of the one or more optical elements form a sub-assembly held together by an additional apparatus, wherein the optical element acting as a protective front cover is not included in the sub-assembly.

2. The camera assembly as defined in claim 1, wherein at least one local non-substantial deviation is an indentation in the three-dimensional outer surface that positions and protects one of the electronic camera modules.

3. The camera assembly as defined in claim 1, wherein the mounting apparatus has shock reducing properties.

4. The camera assembly as defined in claim 1, wherein a longest outer dimension of the at least one electronic camera module has a length between about 4 mm and about 28 mm, between about 10 mm and about 24 mm, or between about 16 mm and about 20 mm.

5. The camera assembly of claim 1,
   wherein the encasement comprises two or more parts interconnected at a set of mechanical interfaces to form the integral mechanical enclosure, the set of mechanical interfaces dividing up the three-dimensional outer surface, and
   wherein the at least one electronic camera module having the orientation substantially non-perpendicular to the imaginary planar surface area is located adjacent a mechanical interface of the set of mechanical interfaces, and is inclined in a direction toward the mechanical interface in order to rotate the optical view position axis toward the mechanical interface so that a dead view zone adjacent the mechanical interface orris minimized.

6. The camera assembly as defined in claim 1, wherein the three-dimensional outer surface of the encasement is substantially spherical.

7. The camera assembly as defined in claim 1, wherein an angle between the optical view position axis of the at least one electronic camera module having the orientation substantially non-perpendicular to the imaginary planar surface area and a perpendicular orientation with respect to the imaginary planar surface area is between about 1° and about 30°, or between about 2° and about 20°, or between about 3° and about 12°.

8. The camera assembly of claim 1, further comprising an adapter connection for accepting an accessory.

9. The camera assembly of claim 1, wherein the orientation of the optical view position axis of at least one electronic camera module of the set of the three or more electronic camera modules is substantially non-parallel to an imaginary line passing through the center of the imaginary sphere analog to an optical center of the at least one electronic camera module.

10. The camera assembly of claim 9, wherein an angle between the optical view position axis of the at least one electronic camera module having an orientation substantially non-parallel to the imaginary line, and the imaginary line, is between about 1° and about 30°, or between about 2° and about 20°, or between about 3° and about 12°, and/or
   wherein a distance between an optical center of each of the three or more electronic camera modules and the surface of the imaginary sphere is between about 2 mm and about 15 mm, or between about 4 mm and about 12 mm, or between about 6 mm and about 10 mm.

11. A camera assembly for capturing a substantial portion of a spherical image, the camera assembly comprising:
   i. an encasement to provide an integral mechanical enclosure for the camera assembly, the encasement comprising a three-dimensional outer surface having substantial non-planar surface portions;
   ii. three or more electronic camera modules positioned in the encasement;
   iii. one or more electronic circuit boards;
   iv. one or more energy source components; and
   v. one or more electronic cable structures interconnecting the electronic circuit boards, the camera modules and the energy source components,
   wherein the orientation of the optical view position axis of each electronic camera module is different from the orientation of the optical view position axis of all but at least one other electronic camera module,
   wherein at least one electronic cable structure interconnects at least one electronic circuit board and at least two camera modules and has a main flat extension,
   wherein the at least one electronic cable structure includes a set of conductors arranged adjacent each other in the main flat extension,
   wherein the at least one electronic cable structure has at least two extension portions connecting to the at least two camera modules, each extension portion and a corresponding routing of the corresponding conductors of the set of conductors are positioned in its extension, and/or
   wherein the at least one electronic cable structure is a passive printed circuit board (PCB) having substantially flexible portions; and
   the camera assembly having a central weight distribution.

12. The camera assembly of claim 11, wherein the encasement has a substantially spherical shape, and an imaginary outer spherical surface analog representing an overall structural shape envelope of spherical shape, and the at least one energy source component is positioned and fixed within the encasement at the center of the imaginary outer spherical surface analog.

* * * * *